(12) United States Patent
Kimura

(10) Patent No.: US 8,531,560 B2
(45) Date of Patent: Sep. 10, 2013

(54) FOCUS DETECTION APPARATUS AND METHOD FOR CONTROLLING THE SAME

(75) Inventor: Masafumi Kimura, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 48 days.

(21) Appl. No.: 12/919,615

(22) PCT Filed: Nov. 11, 2009

(86) PCT No.: PCT/JP2009/069519
§ 371 (c)(1),
(2), (4) Date: Aug. 26, 2010

(87) PCT Pub. No.: WO2010/067693
PCT Pub. Date: Jun. 17, 2010

(65) Prior Publication Data
US 2011/0228145 A1 Sep. 22, 2011

(30) Foreign Application Priority Data

Dec. 10, 2008 (JP) ................. 2008-315027

(51) Int. Cl.
*H04N 9/64* (2006.01)
(52) U.S. Cl.
USPC ........................................ 348/247
(58) Field of Classification Search
USPC ............ 348/243, 245, 246, 247, 248, 249, 348/345, 349, 350
See application file for complete search history.

(56) References Cited

U.S. PATENT DOCUMENTS

2009/0284645 A1* 11/2009 Nozaki et al. ............. 348/349
2010/0073527 A1* 3/2010 Ichimiya ................ 348/247
2010/0245631 A1* 9/2010 Hoda et al. ............... 348/241
2010/0277625 A1* 11/2010 Utsugi .................. 348/246
2011/0007176 A1* 1/2011 Hamano .................. 348/222.1

FOREIGN PATENT DOCUMENTS

| JP | 05-056355 A | 3/1993 |
| JP | 08-054560 A | 2/1996 |
| JP | 10-010420 A | 1/1998 |
| JP | 2001-177756 A | 6/2001 |
| JP | 2009-258144 A | 11/2009 |
| JP | 2010-091848 A | 4/2010 |

OTHER PUBLICATIONS

The above references were cited in a Aug. 17, 2012 Japanese Office Action, which is enclosed without an English Translation, that issued in Japanese Patent Application No. 2008-315027.

* cited by examiner

*Primary Examiner* — Aung S Moe
(74) *Attorney, Agent, or Firm* — Cowan, Liebowitz & Latman, P.C.

(57) ABSTRACT

A camera has a focus detection sensor that includes a plurality of first focus detection pixels and a plurality of second focus detection pixels, and that has a plurality of focus detection pixel pairs each including a first focus detection pixel and a second focus detection pixel, and stores defect information indicating a defective pixel. The camera corrects a value of the defective pixel and a value of one of the first focus detection pixel and the second focus detection pixel that forms the focus detection pixel pair with the defective pixel based on a value of a focus detection pixel of the same type that is not the defective pixel. The camera detects focusing status based on a phase difference between a first focus detection image obtained from the first focus detection pixels and a second focus detection image obtained from the second focus detection pixels after the correction.

6 Claims, 28 Drawing Sheets

FIG. 4A
FIG. 4B
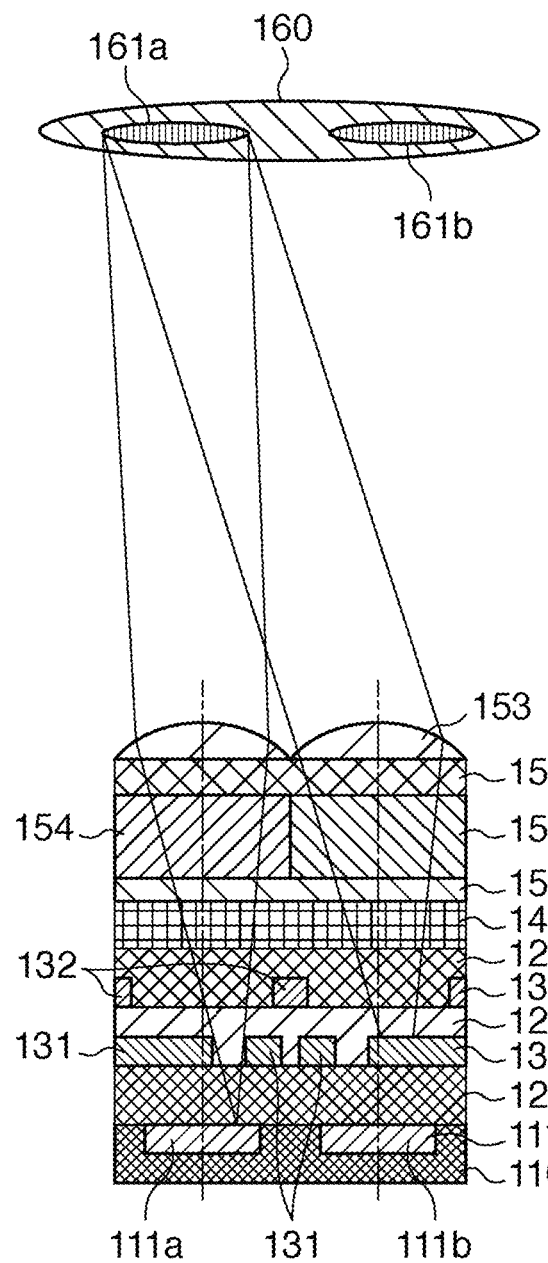
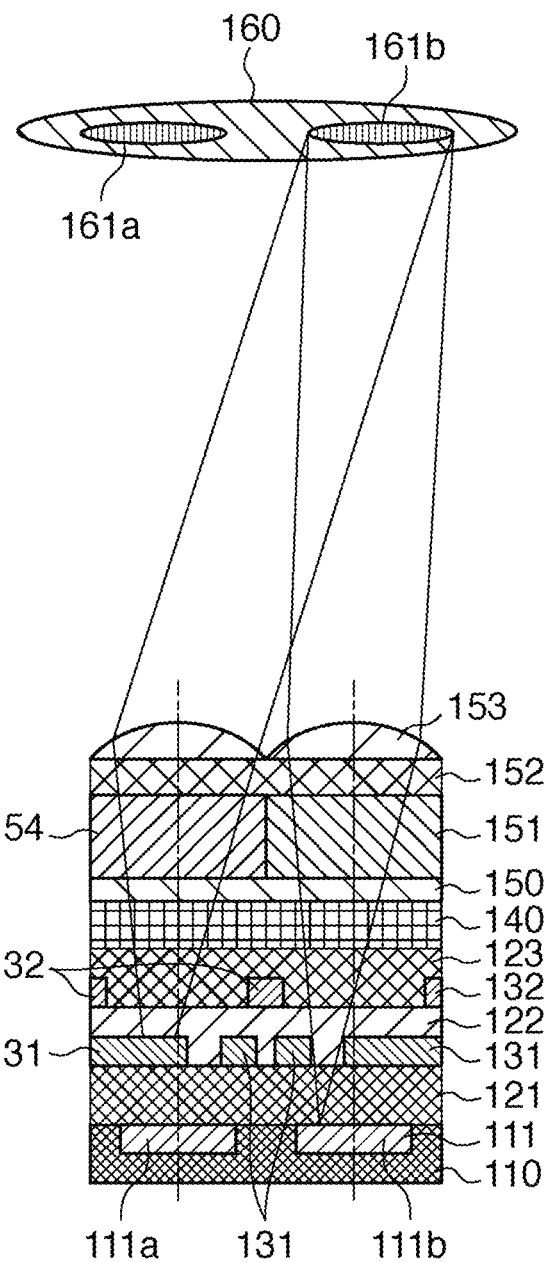
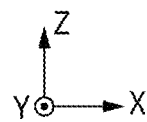
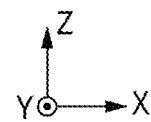

FIG. 10

FOCUS DETECTION A IMAGE

| 1A1 | 1A2 | 1A3 | 1A4 | 1A5 | 1A6 | 1A7 | 1A8 | 1A9 | 1A10 | 1A11 | 1A12 |
|---|---|---|---|---|---|---|---|---|---|---|---|
| 2A1 | 2A2 | 2A3 | 2A4 | 2A5 | 2A6 | 2A7 | 2A8 | 2A9 | 2A10 | 2A11 | 2A12 |
| 3A1 | 3A2 | 3A3 | 3A4 | 3A5 | 3A6 | 3A7 | 3A8 | 3A9 | 3A10 | 3A11 | 3A12 |
| 4A1 | 4A2 | 4A3 | 4A4 | 4A5 | 4A6 | 4A7 | 4A8 | 4A9 | 4A10 | 4A11 | 4A12 |

FOCUS DETECTION B IMAGE

| 1B1 | 1B2 | 1B3 | 1B4 | 1B5 | 1B6 | 1B7 | 1B8 | 1B9 | 1B10 | 1B11 | 1B12 |
|---|---|---|---|---|---|---|---|---|---|---|---|
| 2B1 | 2B2 | 2B3 | 2B4 | 2B5 | 2B6 | 2B7 | 2B8 | 2B9 | 2B10 | 2B11 | 2B12 |
| 3B1 | 3B2 | 3B3 | 3B4 | 3B5 | 3B6 | 3B7 | 3B8 | 3B9 | 3B10 | 3B11 | 3B12 |
| 4B1 | 4B2 | 4B3 | 4B4 | 4B5 | 4B6 | 4B7 | 4B8 | 4B9 | 4B10 | 4B11 | 4B12 |

| | | | | | | | | | | | |
|---|---|---|---|---|---|---|---|---|---|---|---|
| (1) k = 2 [bit] | | | | | | | | | | | |
| FOCUS DETECTION A IMAGE | 2A₃ | 2A₄ | 2A₅ | 2A₆ | 2A₇ | 2A₈ | 2A₉ | 2A₁₀ | 2A₁₁ | 2A₁₂ | | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₅ |
| (2) k = 1 [bit] | | | | | | | | | | | |
| FOCUS DETECTION A IMAGE | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₆ |
| (3) k = 0 [bit] | | | | | | | | | | | |
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₇ |
| (4) k = −1 [bit] | | | | | | | | | | | |
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₂ | 2B₃ | 2B₄ | 2B₅ | 2B₆ | 2B₇ | 2B₈ | 2B₉ | 2B₁₀ | 2B₁₁ | 2B₁₂ | | ELIMINATE 2B₈ |
| (5) k = −2 [bit] | | | | | | | | | | | |
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₃ | 2B₄ | 2B₅ | 2B₆ | 2B₇ | 2B₈ | 2B₉ | 2B₁₀ | 2B₁₁ | 2B₁₂ | | | ELIMINATE 2B₉ |

CORRELATION CALCULATION RANGE

FIG. 19

| | | | | | | | | | | | |
|---|---|---|---|---|---|---|---|---|---|---|---|
| (1) k = 2 [bit] | | | | | CORRELATION CALCULATION RANGE | | | | | | |
| FOCUS DETECTION A IMAGE | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₇ |

| (2) k = 1 [bit] | | | | | | | | | | | |
|---|---|---|---|---|---|---|---|---|---|---|---|
| FOCUS DETECTION A IMAGE | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₇ |

| (3) k = 0 [bit] | | | | | | | | | | | |
|---|---|---|---|---|---|---|---|---|---|---|---|
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₁ | 2B₂ | 2B₃ | 2B₄ | 2B₅ | 2B₆ | 2B₇ | 2B₈ | 2B₉ | 2B₁₀ | 2B₁₁ | 2B₁₂ | ELIMINATE 2B₇ |

| (4) k = −1 [bit] | | | | | | | | | | | |
|---|---|---|---|---|---|---|---|---|---|---|---|
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₂ | 2B₃ | 2B₄ | 2B₅ | 2B₆ | 2B₇ | 2B₈ | 2B₉ | 2B₁₀ | 2B₁₁ | 2B₁₂ | | ELIMINATE 2B₇ |

| (5) k = −2 [bit] | | | | | | | | | | | |
|---|---|---|---|---|---|---|---|---|---|---|---|
| FOCUS DETECTION A IMAGE | 2A₁ | 2A₂ | 2A₃ | 2A₄ | 2A₅ | 2A₆ | 2A₇ | 2A₈ | 2A₉ | 2A₁₀ | 2A₁₁ | 2A₁₂ | ELIMINATE 2A₇ |
| FOCUS DETECTION B IMAGE | 2B₃ | 2B₄ | 2B₅ | 2B₆ | 2B₇ | 2B₈ | 2B₉ | 2B₁₀ | 2B₁₁ | 2B₁₂ | | | ELIMINATE 2B₇ |

F I G. 20A
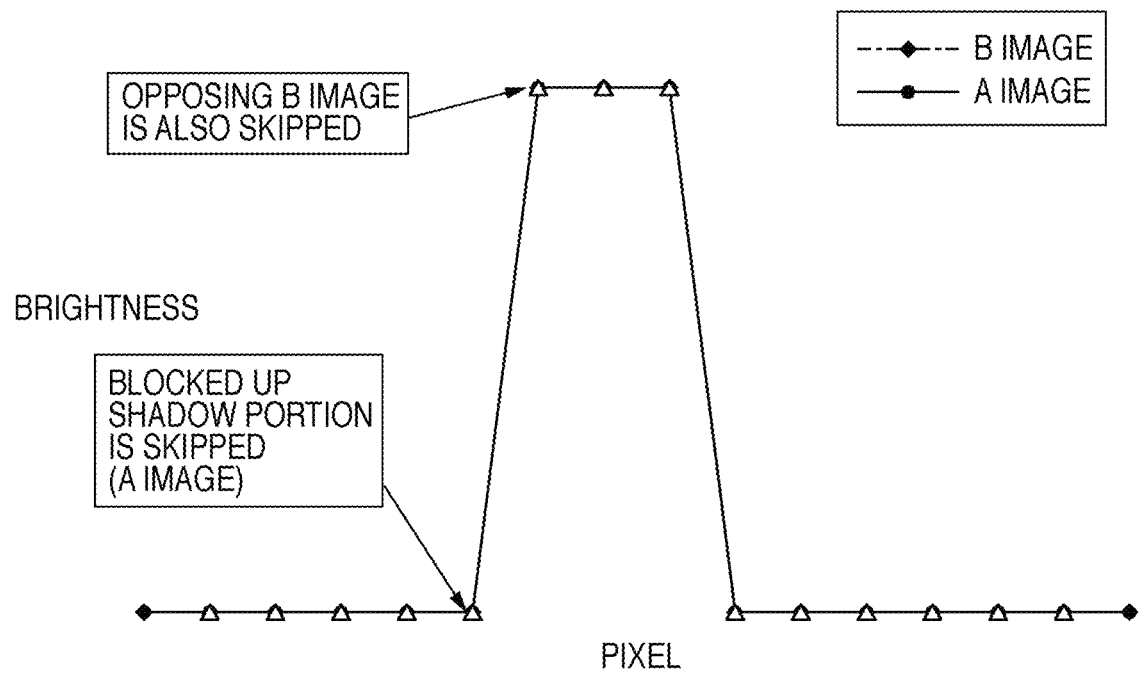

FOCUS DETECTION APPARATUS AND METHOD FOR CONTROLLING THE SAME

TECHNICAL FIELD

The present invention relates to a focus detection apparatus and a method for controlling the same.

BACKGROUND ART

Recently, as the performance of focus detection apparatuses has become higher, many focus detection apparatuses of a so-called multi-point focus detection-type have been proposed that can perform focus detection at many points in a finder. In a focus detection apparatus that performs multi-point focus detection using the principle of a phase difference AF, a method is used in which a pair of focus detection images corresponding to the respective focus detection points is obtained to perform a correlation calculation, and the amount of defocus is calculated from a phase difference therebetween.

In this sort of focus detection apparatus, the number of photoelectric conversion portions for obtaining focus detection images has increased as the number of focus detection points increases. Conversely, it is very difficult to completely eliminate manufacturing defects in these photoelectric conversion portions. Japanese Patent Laid-Open No. 5-56355 discloses a technique for reducing the influence of a defect by interpolating a defective photoelectric conversion signal from the nearby signals. Furthermore, Japanese Patent Laid-Open No. 2001-177756 discloses a technique for eliminating the influence of a defect by using, as a focus detection signal, a portion that contains no defect among closely arranged photoelectric conversion portions.

Generally, a focus detection apparatus is required to be precise at the time of in-focus operation. Here, "precision at the time of in-focus operation" refers to the degree of absence of a difference between an image plane (position having the highest spatial frequency) of an imaging optical system and an in-focus position obtained by the focus detection apparatus.

However, in the methods described in Japanese Patent Laid-Open Nos. 5-56355 and 2001-177756, since a defective pixel in one focus detection image of a pair of focus detection images is interpolated, the correlation with the other focus detection image is lost, and such influences occur in a correlation calculation using the pair of focus detection images. Thus, the precision at the time of in-focus operation may be lowered. In particular, such influences easily occur in the case where a defective pixel is positioned at a characteristic point in an object image, such as the contour of an object.

DISCLOSURE OF INVENTION

The present invention provides a focus detection apparatus that can prevent the precision at the time of in-focus operation from being lowered even in the case where there is a defective pixel, and a method and a program for controlling the same.

A first aspect of the present invention is directed to a focus detection apparatus that detects a focusing status on an image plane obtained using an imaging optical system, comprising: a focus detection sensor that includes a plurality of first focus detection pixels and a plurality of second focus detection pixels, and that has a plurality of focus detection pixel pairs each including a first focus detection pixel and a second focus detection pixel; a storage means that stores defect information indicating a defective pixel of the focus detection sensor; a correction means that corrects a value of the defective pixel indicated by the defect information and a value of one of the first focus detection pixel and the second focus detection pixel that forms the focus detection pixel pair with the defective pixel based on a value of a focus detection pixel of a same type that is not the defective pixel; and a detecting means that detects the focusing status based on a phase difference between a first focus detection image obtained from the first focus detection pixels and a second focus detection image obtained from the second focus detection pixels of the plurality of focus detection pixel pairs after the correction performed by the correction means.

Furthermore, a second aspect of the present invention is directed to a focus detection apparatus that detects a focusing status on an image plane obtained using an imaging optical system, comprising: a focus detection sensor that includes a plurality of first focus detection pixels and a plurality of second focus detection pixels, and that has a plurality of focus detection pixel pairs each including a first focus detection pixel and a second focus detection pixel; a storage means that stores defect information indicating a defective pixel of the focus detection sensor; an eliminating means that eliminates a value of the defective pixel indicated by the defect information and a value of one of the first focus detection pixel and the second focus detection pixel that forms the focus detection pixel pair with the defective pixel so as not to use the values for detecting the focusing status; and a detecting means that detects the focusing status based on a phase difference between a first focus detection image obtained from the first focus detection pixels and a second focus detection image obtained from the second focus detection pixels of the plurality of focus detection pixel pairs after the elimination performed by the eliminating means.

Furthermore, a third aspect of the present invention is directed to a method for controlling a focus detection apparatus that includes: a focus detection sensor that includes a plurality of first focus detection pixels and a plurality of second focus detection pixels, and that has a plurality of focus detection pixel pairs each including a first focus detection pixel and a second focus detection pixel; and a storage means that stores defect information indicating a defective pixel of the focus detection sensor; and that detects a focusing status on an image plane obtained using an imaging optical system, comprising: a correcting step of performing correction of a value of the defective pixel indicated by the defect information and a value of one of the first focus detection pixel and the second focus detection pixel that forms the focus detection pixel pair with the defective pixel based on a value of a focus detection pixel of a same type that is not the defective pixel; and a detecting step of performing detection of the focusing status based on a phase difference between a first focus detection image obtained from the first focus detection pixels and a second focus detection image obtained from the second focus detection pixels of the plurality of focus detection pixel pairs after the correction performed in the correcting step.

Furthermore, a fourth aspect of the present invention is directed to a method for controlling a focus detection apparatus that includes: a focus detection sensor that includes a plurality of first focus detection pixels and a plurality of second focus detection pixels, and that has a plurality of focus detection pixel pairs each including a first focus detection pixel and a second focus detection pixel; and a storage means that stores defect information indicating a defective pixel of the focus detection sensor; and that detects a focusing status on an image plane obtained using an imaging optical system, comprising: an eliminating step of performing elimination of a value of the defective pixel indicated by the defect information and a value of one of the first focus detection pixel and the second focus detection pixel that forms the focus detection pixel pair with the defective pixel so as not to use the values for detecting the focusing status; and a detecting step of performing detection of the focusing status based on a phase difference between a first focus detection image obtained from the first focus detection pixels and a second focus detection image obtained from the second focus detection pixels of the plurality of focus detection pixel pairs after the elimination performed in the eliminating step.

Further features of the present invention will become apparent from the following description of exemplary embodiments with reference to the attached drawings.

BRIEF DESCRIPTION OF DRAWINGS

FIG. 4A is a view illustrating pupil division of focus detection pixels by exemplifying the optical paths of light fluxes that have passed through a pupil region of an imaging lens, and FIG. 4B is a view illustrating pupil division of focus detection pixels by exemplifying the optical paths of light fluxes that have passed through a pupil region of the imaging lens.

FIG. 10 is a view exemplifying focus detection images obtained by extracting focus detection pixels.

FIG. 11 is a view schematically showing the state of focus detection images when performing a correlation calculation according to the first embodiment.

FIG. 12 is a view schematically showing the state of focus detection images when performing a correlation calculation again in the first embodiment.

FIGS. 14A and 14B are graphs showing focus detection images and the correlation amount thereof when initially obtaining the correlation amount in the first embodiment, wherein FIG. 14A is a graph showing the relationship between line images obtained by focus detection pixel groups and brightness, and FIG. 14B is a graph showing the correlation amount obtained by calculation.

FIGS. 15A and 15B are graphs showing focus detection images and the correlation amount thereof when obtaining the correlation amount again in the first embodiment, wherein FIG. 15A is a graph showing the relationship between line images obtained by focus detection pixel groups and line images when obtaining the correlation amount again, and brightness, and FIG. 15B is a graph showing the correlation amount obtained by calculation.

FIGS. 16A and 16B are graphs showing focus detection images and the correlation amount thereof in the case where the present invention is not applied, wherein FIG. 16A is a graph showing the relationship between line images obtained by focus detection pixel groups and line images when obtaining the correlation amount, and brightness, and FIG. 16B is a graph showing the correlation amount obtained by calculation.

FIG. 18 is a view schematically showing the state of focus detection images when performing a correlation calculation according to the second embodiment.

FIG. 19 is a view schematically showing the state of focus detection images when performing a correlation calculation again in the second embodiment.

FIGS. 20A and 20B are graphs showing focus detection images and the correlation amount thereof when initially obtaining the correlation amount in the second embodiment, wherein FIG. 20A is a graph showing the relationship between line images obtained by focus detection pixel groups and brightness, and FIG. 20B is a graph showing the correlation amount obtained by calculation.

FIGS. 21A and 21B are graphs showing focus detection images and the correlation amount thereof when obtaining the correlation amount again in the second embodiment, wherein FIG. 21A is a graph showing the relationship between line images obtained by focus detection pixel groups and line images when obtaining the correlation amount again, and brightness, and FIG. 21B is a graph showing the correlation amount obtained by calculation.

BEST MODE FOR CARRYING OUT THE INVENTION

Hereinafter, exemplary embodiments of the present invention will be described with reference to the accompanying drawings, but the present invention is not limited to the following embodiments.

First Embodiment

Figure 1:
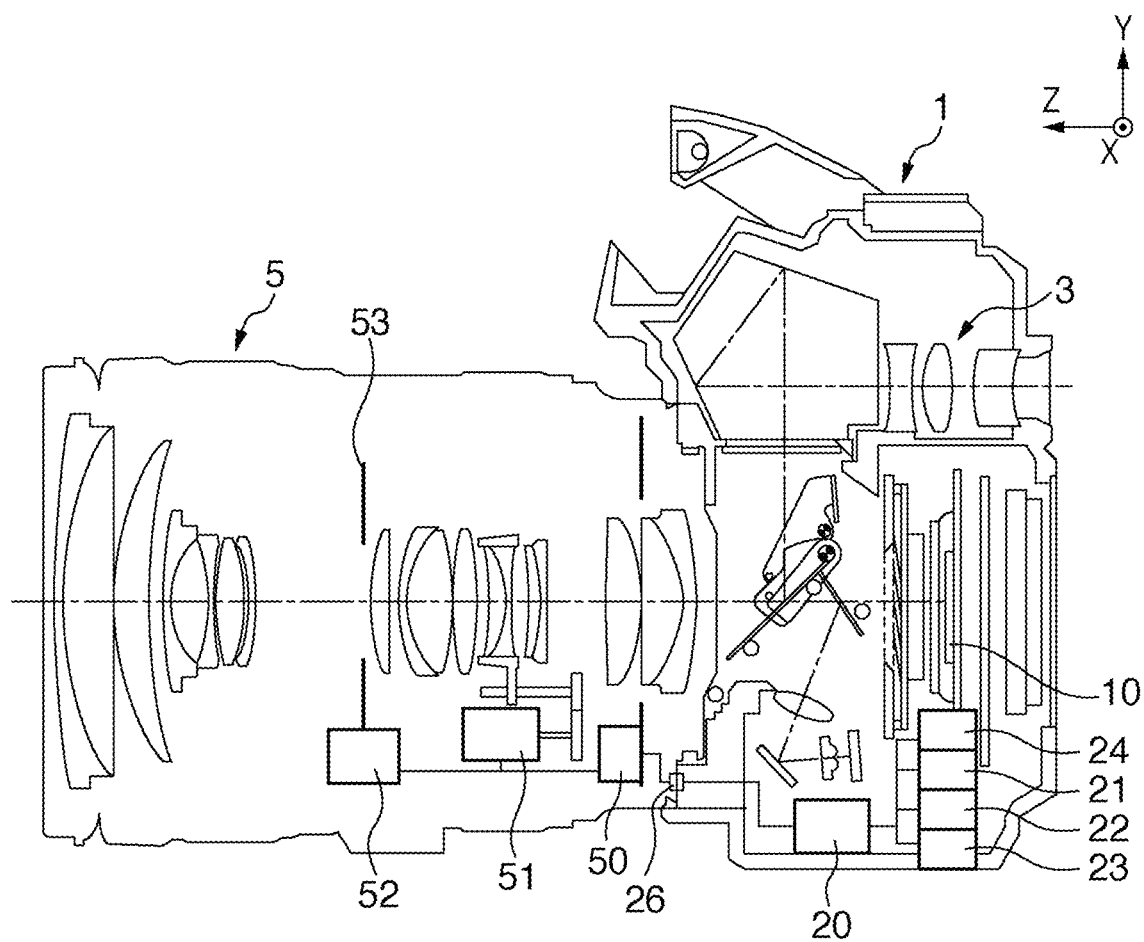
FIG. 1 is a view schematically showing the configuration of a camera according to a first embodiment.

Hereinafter, a first embodiment will be described with reference to FIGS. 1 to 16B. FIG. 1 is a cross-sectional view schematically showing the configuration of a camera 1 that includes a focus detection apparatus according to the first embodiment. As shown in FIG. 1, the camera 1 is a digital still camera in which an image sensor 10 (imaging element) is disposed on a plane that is calculated to be an image plane (hereinafter, referred to as an "image plane") of an imaging lens 5 functioning as an imaging optical system.

The camera 1 includes an ocular 3, a CPU 20, an image sensor control circuit 21, a memory circuit 22, an interface circuit 23, and an image-processing circuit 24. The ocular 3 is an optical lens that is used by a user to observe an object image incident from the imaging lens 5. The CPU (central processing unit) 20 centrally controls the operation of the camera 1. Furthermore, the CPU 20 also functions as a detecting means for detecting the focusing status on the imaging lens 5.

The image sensor control circuit 21 controls the driving of the image sensor 10 under the control of the CPU 20. The memory circuit 22 stores image data or the like imaged by the image sensor 10. Also, the memory circuit 22 stores in advance information on the light-receiving distribution of the image sensor 10, and defect information on a focus detection sensor (described later) as a defect storage means.

The interface circuit 23 is communicably connected via a connector (not shown) or the like to an external apparatus, and outputs, for example, image data, on which image processing has been performed by the image-processing circuit 24, to the external apparatus connected thereto. The image-processing circuit 24 performs predetermined image processing on image data imaged by the image sensor 10.

The imaging lens 5 is a lens that can be attached to and detached from the main body of the camera 1. In the imaging lens 5, information transmitted from the CPU 20 of the main body of the camera 1 via an electric contact point 26 is received by a lens CPU 50. The information transmitted from the CPU 20 is information on the control of the driving of the imaging lens 5, and, more specifically, is focus adjustment information for adjusting the focus, aperture adjustment information for adjusting the aperture, and the like. A lens drive mechanism 51 is, for example, an actuator that drives a focus lens. An aperture drive mechanism 52 is, for example, an actuator that drives an aperture apparatus 53. The aperture apparatus 53 adjusts the amount of incident light using aperture blades or the like.

The lens CPU 50 drives the lens drive mechanism 51 based on the focus adjustment information transmitted from the CPU 20, thereby obtaining in-focus status of an object image formed on the image sensor 10. Furthermore, the lens CPU 50 drives the aperture drive mechanism 52 based on the aperture adjustment information transmitted from the CPU 20, thereby narrowing the aperture apparatus 53 to a predetermined aperture value.

Figure 2:
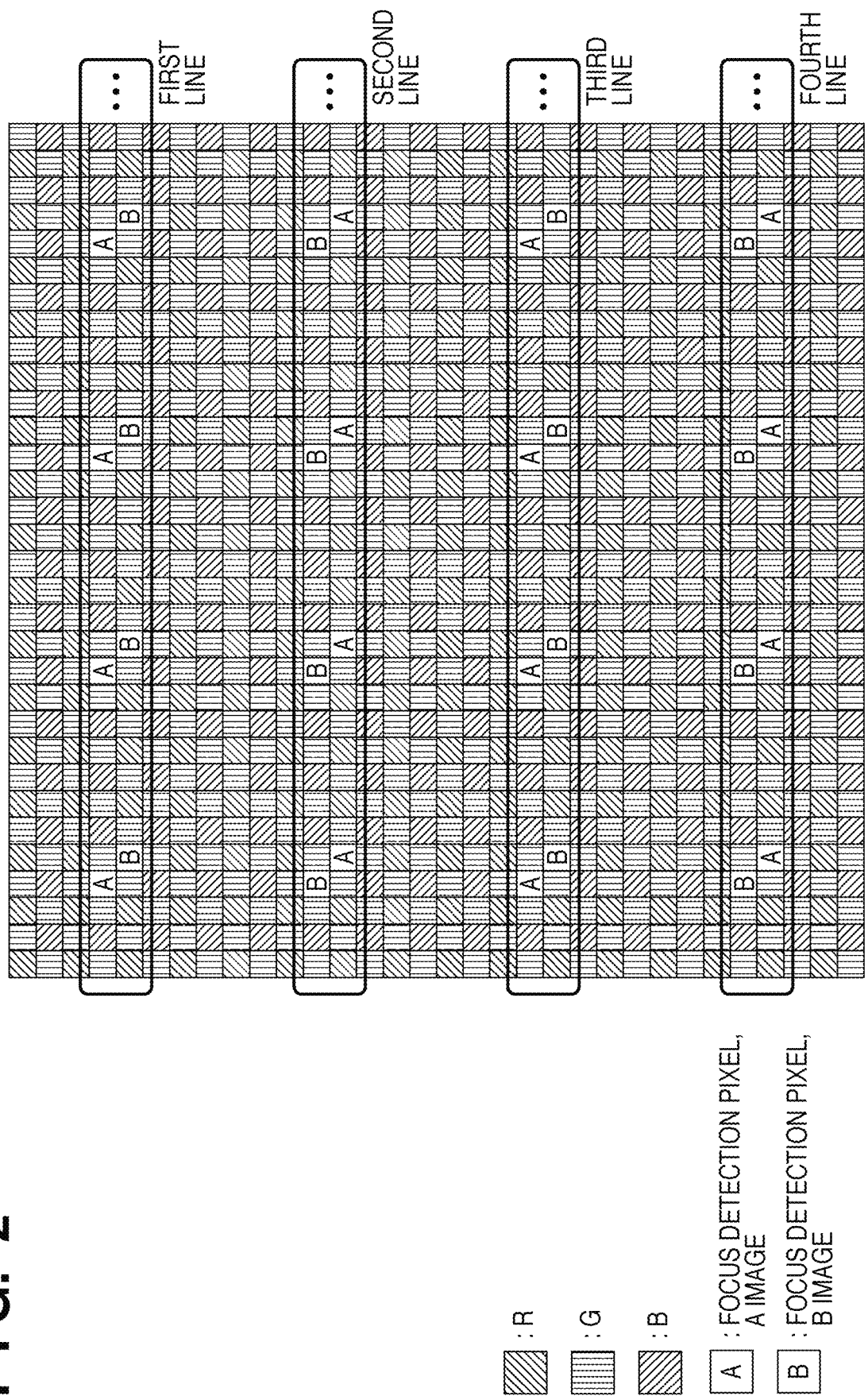
FIG. 2 is a view exemplifying part of a region of an image sensor.

FIG. 2 is a plan view exemplifying part of a region of the image sensor 10. In FIG. 2, the letters "R", "G", and "B" indicate the hues of the color filters of respective pixels in the image sensor 10. The pixel with the letter "R" transmits light with a red component, the pixel with the letter "G" transmits light with a green component, and the pixel with the letter "B" transmits light with a blue component. In FIG. 2, the hues "R", "G", and "B" are indicated by hatched patterns. As clearly seen from the hatched patterns in FIG. 2, the pixels "R", "G", and "B" in the image sensor 10 are arranged according to a so-called Bayer array.

Since the color filters are arranged according to the Bayer array, one picture element includes a pixel "R", a pixel "B", and two pixels "G". Furthermore, in the image sensor 10, a plurality of focus detection pixels that receive light fluxes that have passed through part of a pupil region of the imaging lens 5 are allocated to the parts of pixels that are to be "R" or "B". More specifically, pixels indicated by A and B in FIG. 2 are focus detection pixels (first focus detection pixels and second focus detection pixels) for detecting the focusing status on the imaging lens 5. Furthermore, the focus detection pixels form a focus detection pixel pair (hereinafter, referred to as a "pixel pair") in which a combination of one A pixel and one B pixel detects a phase difference. Furthermore, as shown in FIG. 2, a plurality of such pixel pairs are arranged in a dispersed manner at a predetermined pitch in the image sensor 10.

A detailed configuration of the focus detection pixels will be described later, but the openings in the X direction (the horizontal direction in FIG. 2) are restricted by first electrodes 131 shown in FIG. 3. Furthermore, as described later, images of light fluxes that have passed through mutually different pupil regions are formed on the focus detection pixels A and B. Accordingly, the image sensor 10 functions as a focus detection sensor that includes parts of the pixels of the imaging lens 5 as focus detection pixels A and B, and that has a plurality of such pixel pairs.

As shown in FIG. 2, in the image sensor 10, the focus detection pixels indicated by A and B are arranged adjacent to each other, and the distance therebetween is made as short as possible. Thus, the possibility that the focus detection pixels indicated by A and B capture different patterns of an object image is suppressed so as to be as low as possible, and focus detection errors are reduced.

Furthermore, in the image sensor 10, the boundary positions in an even-numbered line and in an odd-numbered line are arranged to match each other, and the positions of the focus detection pixels indicated by A and B are inverted. Thus, in the case where an edge portion of an object image is positioned at the boundary portion between the focus detection pixels indicated by A and B, when the phases of images obtained from the focus detection pixels indicated by A and B are shifted, the phase shifts simultaneously occur. Moreover, the shift amounts in the images obtained from the focus detection pixels indicated by A and B are equal to each other, and the directions thereof are in opposite directions. Thus, in this embodiment, a correlation calculation is performed using a set consisting of at least two lines that are adjacent to each other in a pupil division direction and in a vertical direction, and, thus, such focus detection errors cancel each other. This aspect corresponds to an operation in which an even number is always designated in the determination of the number of image pairs described later. Accordingly, focus detection errors can be reduced.

Figure 3:
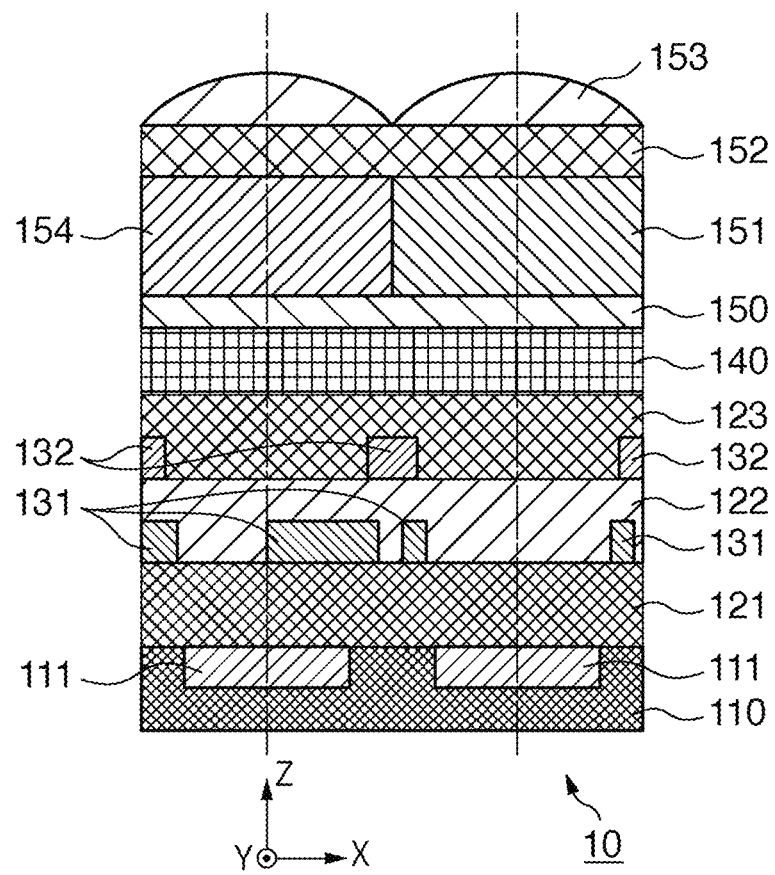
FIG. 3 is a view exemplifying parts of pixels of the image sensor.

FIG. 3 is a view showing a cross-section in the above-described X direction of parts of the pixels of the image sensor 10. More specifically, FIG. 3 is a cross-sectional view of a focus detection pixel in which the opening in the X direction is restricted and a pixel in which the opening is not restricted and light can be received from the entire pupil region. In FIG. 3, the right pixel is a pixel in which light can be received from the entire pupil region of the imaging lens 5. Furthermore, the left focus detection pixel is a pixel in which the opening in the X direction is restricted and light fluxes can be received from part of the pupil region of the imaging lens 5. Here, the operation in which light fluxes are received from part of the pupil region will be described later with reference to FIGS. 4A and 4B.

As shown in FIG. 3, in the image sensor 10, a photoelectric conversion portion 111 is formed in a silicon substrate 110. In the photoelectric conversion portion 111, a signal charge that is generated by performing photoelectric conversion on an object image is output to the outside via a floating diffusion portion (not shown), the first electrodes 131, and a second electrode 132. An inter-layer insulating film 121 is formed between the photoelectric conversion portion 111 and the first electrodes 131, and an inter-layer insulating film 122 is formed between the first electrodes 131 and the second electrode 132.

Furthermore, on the light-incident side (the Z direction) of the second electrode 132, an inter-layer insulating film 123 is formed, and a passivation film 140 and a planarization layer 150 are further formed. On the light-incident side of the planarization layer 150, a color filter layer 151, a planarization layer 152, and a microlens 153 are formed. Here, the optical power of the microlens 153 is set such that the pupil of the imaging lens 5 and the photoelectric conversion portion 111 are substantially conjugate. Furthermore, on the imaging plane of the image sensor 10, the microlens 153 is disposed at the center of a pixel in a pixel that is positioned at the center, and is disposed in a deflected manner toward the optical axis side of the imaging lens 5 in a pixel that is positioned on the periphery.

Object light that has been transmitted through the imaging lens 5 is condensed near the image sensor 10. Furthermore, the light that has reached each pixel of the image sensor 10 is bent by the microlens 153 and condensed at the photoelectric conversion portion 111. In the right pixel shown in FIG. 3 used for ordinary imaging, the first electrodes 131 and the second electrode 132 are arranged such that incident light is not blocked.

On the other hand, in the left focus detection pixel shown in FIG. 3, part of the first electrodes 131 is disposed so as to cover the photoelectric conversion portion 111. As a result, the focus detection pixel can receive only light fluxes that have been transmitted through part of the pupil of the imaging lens 5. Furthermore, since the first electrodes 131 block parts of incident light fluxes, in order to prevent the output of the photoelectric conversion portion 111 from being lowered, a color filter layer 154 of the focus detection pixel is made of a highly transmissive resin that does not absorb light.

FIGS. 4A and 4B are views showing the relationship between the cross-sections of the focus detection pixels A and B exemplified in FIG. 2 and the pupil, and show a pupil division means in each focus detection pixel. FIG. 4A is a view illustrating pupil division by exemplifying the optical paths of light fluxes that have passed through a pupil region 161a of the imaging lens 5, and FIG. 4B is a view illustrating pupil division by exemplifying the optical paths of light fluxes that have passed through a pupil region 161b.

Hereinafter, the pupil division means will be described with reference to FIGS. 4A and 4B. In FIGS. 4A and 4B, the left focus detection pixel corresponds to the focus detection pixel indicated by A in FIG. 2 (hereinafter, referred to as an "A pixel"), and the right focus detection pixel corresponds to the focus detection pixel indicated by B in FIG. 2 (hereinafter, referred to as a "B pixel"). Furthermore, in FIGS. 4A and 4B, a pupil 160 schematically represents the pupil of the imaging lens 5, and photoelectric conversion portions 111a and 111b respectively represent the photoelectric conversion portions of the A pixel and the B pixel.

As shown in FIGS. 4A and 4B, the openings of the A pixel and the B pixel are arranged at different deflection amounts with respect to the optical axis of the microlens 153. Thus, as shown in FIG. 4A, a light flux that has passed through the pupil region 161a reaches the photoelectric conversion portion 111a of the A pixel, but does not reach the photoelectric conversion portion 111b of the B pixel. On the contrary, as shown in FIG. 4B, a light flux that has passed through the pupil region 161b reaches the photoelectric conversion portion 111b of the B pixel, but does not reach the photoelectric conversion portion 111a of the A pixel.

As shown in FIGS. 4A and 4B, in the pupil division means that can obtain a light flux that has passed through part of the region of the pupil of the imaging lens 5, a direction that indicates relative positions of the above-described two regions (the X direction, in this embodiment) is defined as a pupil division direction. Furthermore, a direction that is perpendicular to the pupil division direction in a plane that is orthogonal to the optical axis is defined as a vertical direction. Here, in this embodiment, the image sensor 10 having only focus detection pixels in which the pupil division direction is present in the X direction is exemplified, but the image sensor 10 may also have focus detection pixels in which the pupil division direction is present in the Y direction.

Figure 5A:
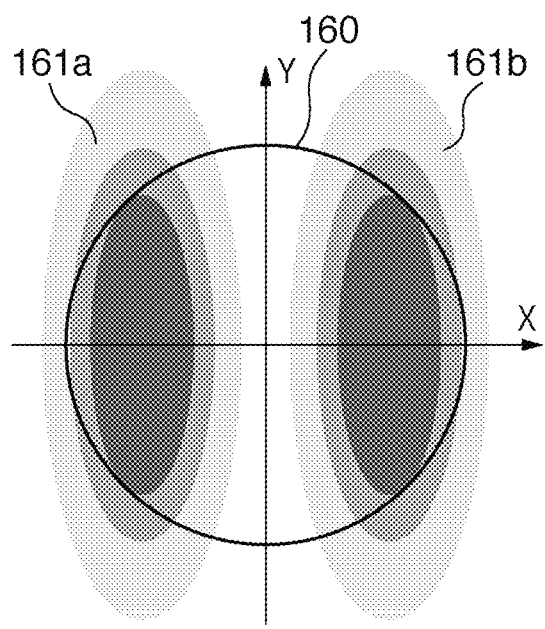
FIG. 5A is a view illustrating the incident characteristics on the focus detection pixels via the pupil plane.
Figure 5B:
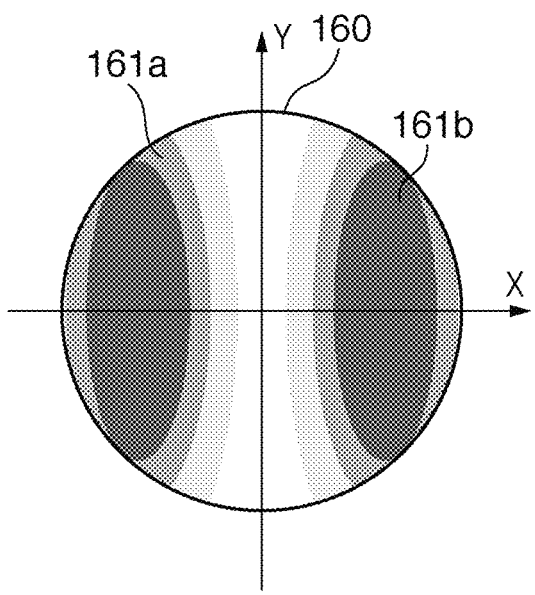
FIG. 5B is a view illustrating the incident characteristics on the focus detection pixels via the pupil plane.

FIGS. 5A and 5B are views schematically showing light fluxes that are incident from the pupil 160 of the imaging lens 5 on the A pixel and the B pixel, and illustrating the incident characteristics on the focus detection pixels via the pupil plane. FIG. 5A exemplifies the relationship between the regions through which light is incident on the A pixel and the B pixel and the pupil, and FIG. 5B exemplifies a state in which the regions through which light is incident on the A pixel and the B pixel are defined by the pupil.

In FIGS. 5A and 5B, a pupil region through which light is incident on the A pixel is denoted by 161a, a pupil region through which light is incident on the B pixel is denoted by 161b, and the incident ratio is indicated by the darkness and lightness. Accordingly, in FIGS. 5A and 5B, a dark region has a large amount of light that is incident therein, and a light region has a small amount of light that is incident therein. In this manner, the incident ratio varies from region to region of the pupil, due to aberration in the microlens, adjustment errors in the optical power, diffraction of light, or the like.

Furthermore, as shown in FIG. 5A, regions through which light is incident on the A pixel and the B pixel are present also outside the pupil 160 of the imaging lens 5. However, since vignetting actually occurs at the lens, light in the range defined by the pupil 160 reaches the image sensor 10 as shown in FIG. 5B.

Figure 6:
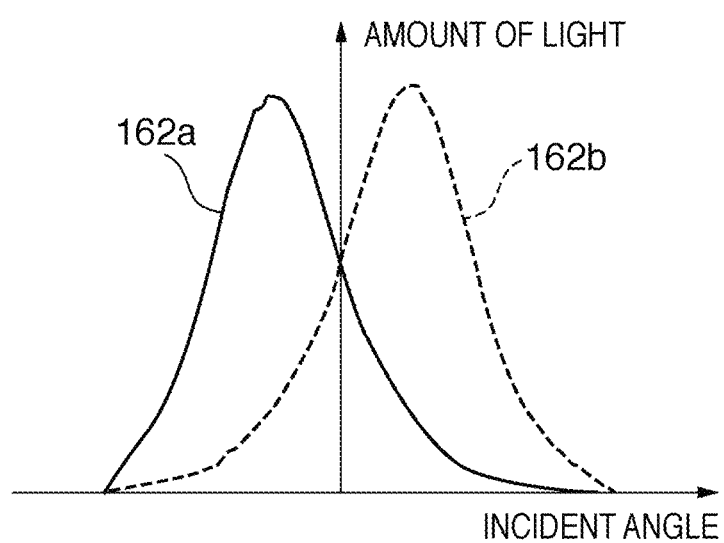
FIG. 6 is an explanatory view of line images generated by the focus detection pixel groups.

FIG. 6 shows a one-dimensional image in the pupil division direction in which light fluxes from the regions shown in FIG. 5B are integrated in the pupil division direction and in the vertical direction, and corresponds to a distribution graph of line images (focus detection images) generated by the focus detection pixel groups. In FIG. 6, a line image distribution curve 162a shows a line image distribution (first focus detection image) of the A pixel group, and a line image distribution curve 162b shows a line image distribution (second focus detection image) of the B pixel group.

As seen from FIG. 6, since the A pixel and the B pixel have mutually different incident angles, an image shift in the pupil division direction occurs between the line image of the A pixel group and the line image of the B pixel group at the time of defocusing. Accordingly, when the amount of defocus is obtained in consideration of the image shift amount and the line image distributions in FIG. 6, focus detection using a so-called phase difference can be performed.

Figure 7:
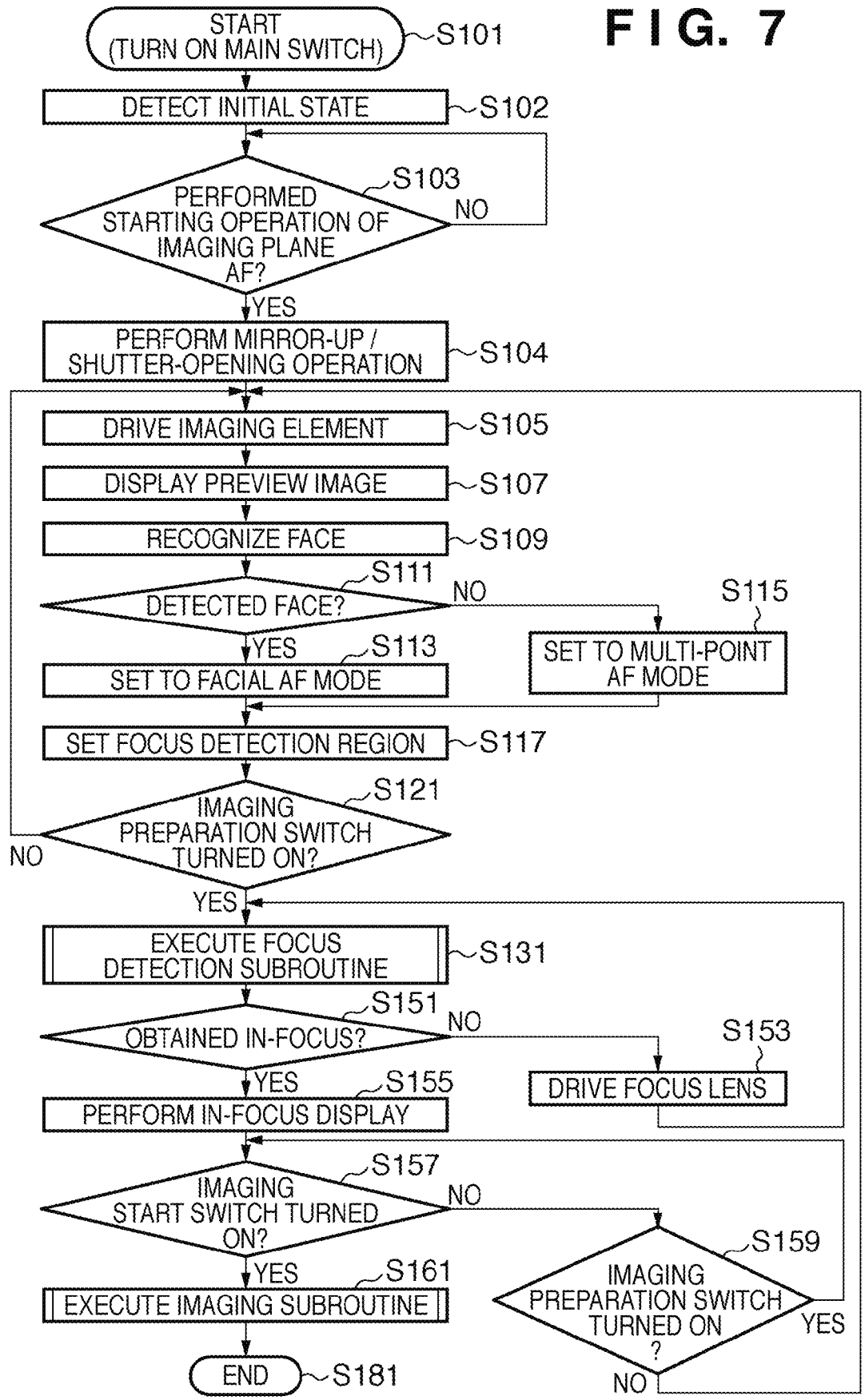
FIG. 7 is a flowchart showing the main process of a camera according to the first embodiment.

Next, the operation relating to focus adjustment and an imaging step of the camera 1 will be described. FIGS. 7 to 9 and 13 are flowcharts illustrating focus adjustment and an imaging step of the camera 1. FIG. 7 is a flowchart showing a main process of the camera 1.

As shown in FIG. 7, when a user turns on a main switch (not shown) of the camera 1, the CPU 20 starts processing (S101). Then, in S102, the CPU 20 performs detection of the initial state such as confirming the operation of each actuator and the image sensor 10 in the camera 1, initializes memory contents and execution programs, and performs an imaging preparation operation.

Then, in S103, the CPU 20 judges whether or not the starting operation of the imaging plane AF of the image sensor 10 is performed according to the operation status with an operation switch (not shown) or the like, and is put on standby until the starting operation of the imaging plane AF is performed. When the starting operation of the imaging plane AF is performed, in S104, the CPU 20 performs a mirror-up operation and a shutter-opening operation.

Then, in S105, the CPU 20 drives the image sensor 10 to start the imaging operation, and reads an image imaged by the image sensor 10. Accordingly, the image sensor 10 outputs a low-pixel moving image for preview.

Then, in S107, the CPU 20 displays, as a preview image, a moving image read from the image sensor 10 on a display (not shown) that is disposed on the rear face of the camera 1. The user can determine the composition at the time of imaging, by visually observing the preview image.

Then, in S109, the CPU 20 recognizes the face of a person using the moving image for preview, and, in S111, judges whether or not the face of a person is detected by facial recognition. If a face is detected from the moving image, the CPU 20 causes the procedure to proceed to S113 where the focus adjustment mode is set to a facial AF mode. Here, "facial AF mode" refers to an AF mode in which a detected face is focused on.

On the other hand, if a face is not detected from the moving image, the CPU 20 causes the procedure to proceed to S115 where the focus adjustment mode is set to a multi-point AF mode. Here, "multi-point AF mode" refers to a mode in which the imaging region of the image sensor 10 is divided by, for example, 3×5=15, focus detection is performed in each divided region, a main object is estimated based on the focus detection results and brightness information for objects, and the main object is caused to be in-focus.

After the AF mode is set in S113 or S115, in S117, the CPU 20 sets a focus detection region according to the set AF mode. For example, in the facial AF mode, the focus detection region is set at the detected facial region, and, in the multi-point AF mode, the focus detection region is set to a region corresponding to the main object.

Then, in S121, the CPU 20 judges whether or not an imaging preparation switch (not shown) is turned on, and, if the switch is not turned on, the procedure returns to S105. Accordingly, the camera 1 repeatedly performs the processing from the driving of the image sensor 10 in S105 to the determination of the focus detection region in S117 until the imaging preparation switch is turned on.

If the imaging preparation switch is turned on in S121, the CPU 20 causes the procedure to proceed to S131 where a focus detection subroutine is executed.

Figure 8:
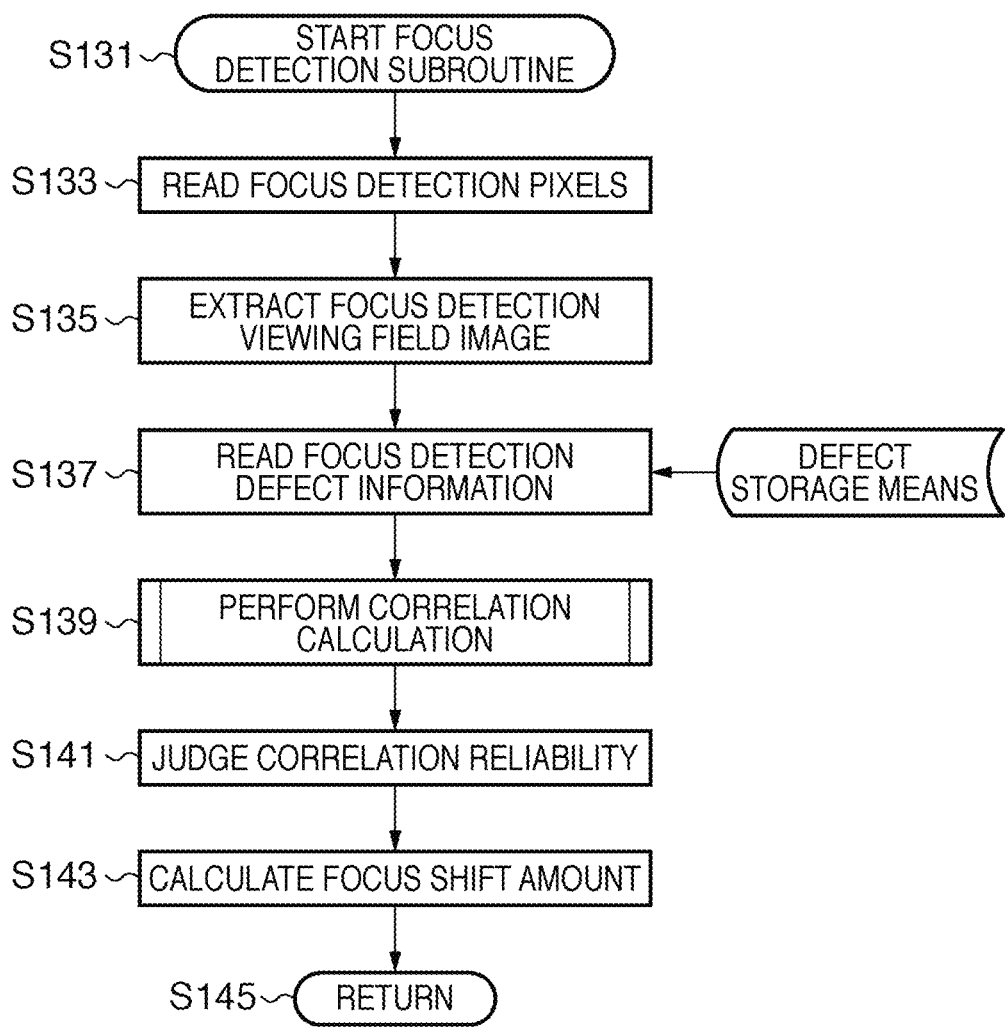
FIG. 8 is a flowchart showing a focus detection subroutine according to the first embodiment.

FIG. 8 is a flowchart showing a focus detection subroutine. In the main process, when the procedure proceeds from S121 to S131 where the focus detection subroutine is started, as shown in FIG. 8, in S133, the CPU 20 reads the focus detection pixels contained in the focus detection region set in S117.

Then, in S135, the CPU 20 extracts a focus detection viewing field image corresponding to the focus detection region set in S117 from the focus detection pixels. Then, in S137, the CPU 20 obtains defect information on a focus detection pixel that is present in the focus detection viewing field image extracted in S135 based on the information on defective pixels checked in advance in a manufacturing step or the like, from the memory circuit 22 functioning as the defect storage means. Then, in S139, the CPU 20 executes a correlation calculation subroutine.

Figure 9:
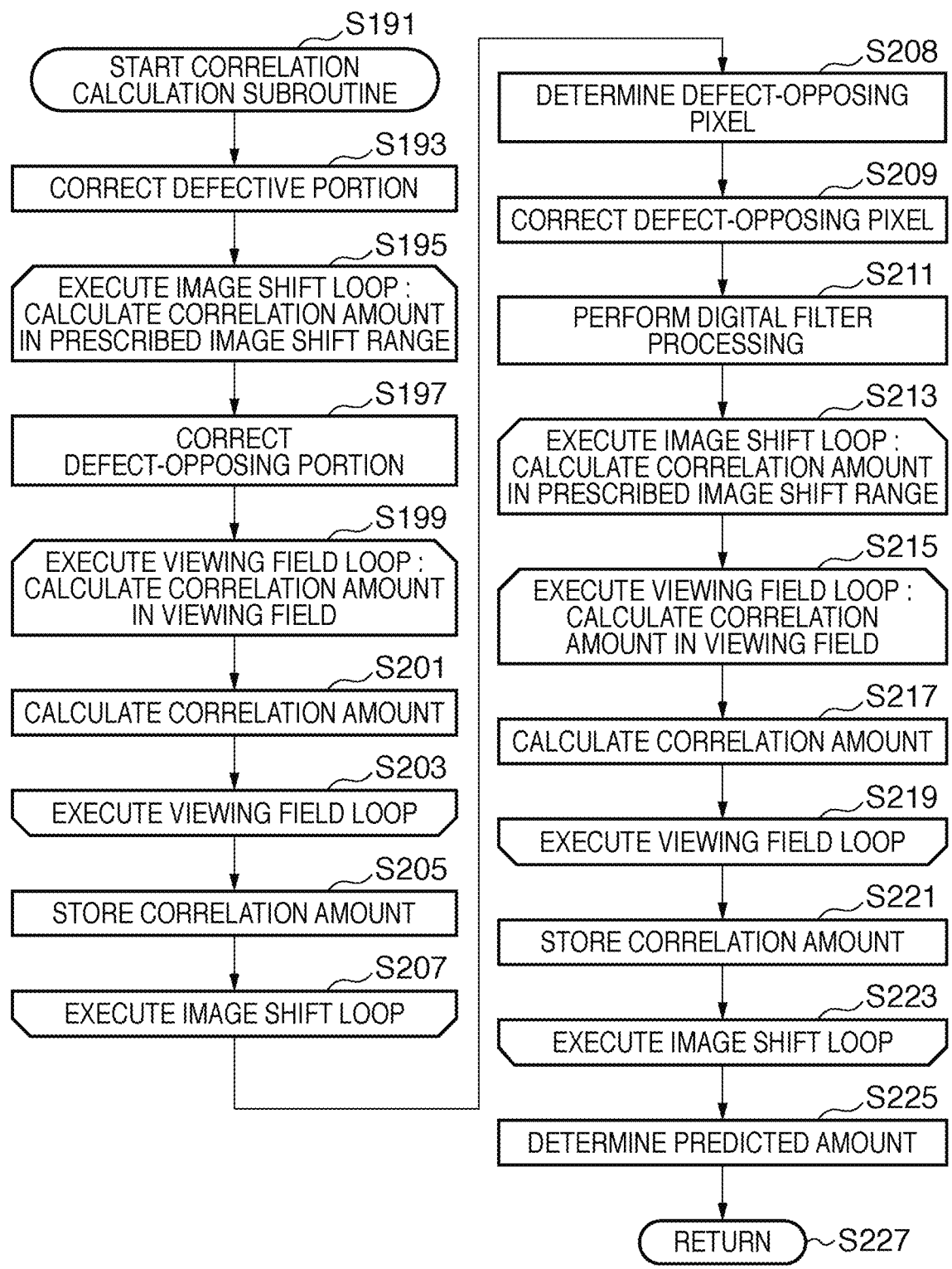
FIG. 9 is a flowchart showing a correlation calculation subroutine according to the first embodiment.

FIG. 9 is a flowchart showing a correlation calculation subroutine. When a correlation calculation subroutine is executed in S139 of the focus detection subroutine, as shown in FIG. 9, the CPU 20 causes the procedure to jump to S191. Then, in S193, the CPU 20 performs correction processing (interpolation processing) on the defective pixel based on the defect information obtained in S137 of the focus detection subroutine.

Then, the CPU 20 performs loop processing on the image shift amount in S195 to S207. More specifically, in S197, the CPU 20 corrects (interpolates) a pixel that opposes the defective pixel obtained in S137, at a position obtained after the image shift. More specifically, the value of a pixel that opposes the defective pixel is interpolated based on a value of a focus detection pixel of the same type that is not the defective pixel. Subsequently, in a viewing field loop in S199 to S203, the CPU 20 calculates the correlation amount in the focus detection viewing field image. In S201, for example, an equation shown below is used to calculate the correlation amount. The interpolation of pixels that oppose each other described above is the main portion of the present invention, and, thus, will be described in detail with reference to FIGS. 10 and 11.

FIG. 10 is a view exemplifying line images according to signals obtained by extracting focus detection pixels arranged in a discrete manner from among signals of the image sensor 10 exemplified in FIG. 2. Signals obtained in the ith row and the jth column of pixels indicated by A and B in FIG. 2 are indicated as iAj and iBj. In this embodiment, j refers to a pupil division direction, and i refers to a direction that is orthogonal to the pupil division direction.

Hereinafter, a description will be given in the case where there is a defect at 2A7 in FIG. 10. (A description will be given in the case where calculation is performed when i=2 in FIG. 10.)

Various methods have been proposed as a method for calculating the correlation amount, but, for example, in the case where a value obtained by adding the absolute value of a difference between two images is defined as the correlation amount, and calculation is performed, the correlation amount COR (k) is obtained as in the following equation (1).

$$\begin{aligned} \text{when } k \geq 0, \quad \text{COR}(k) = \sum_{j}^{nj} |_iA_{j+|k|} - {_iB_j}| \\ \text{when } k < 0, \quad \text{COR}(k) = \sum_{j}^{nj} |_iA_j - {_iB_{j+|k|}}| \end{aligned} \quad (1)$$

In the above equation, i is a value that is determined according to the focus detection viewing field. Furthermore, j corresponds to the focus detection viewing field, and corresponds to the correlation calculation subroutine and the viewing field loop. Furthermore, k refers to the image shift amount, and corresponds to the image shift loop in the correlation calculation subroutine. Furthermore, when the correlation amount is defined as in the equation above, the correlation amount COR (k) is at a minimum at an image shift amount (k) at which the correlation is high.

Figure 11:
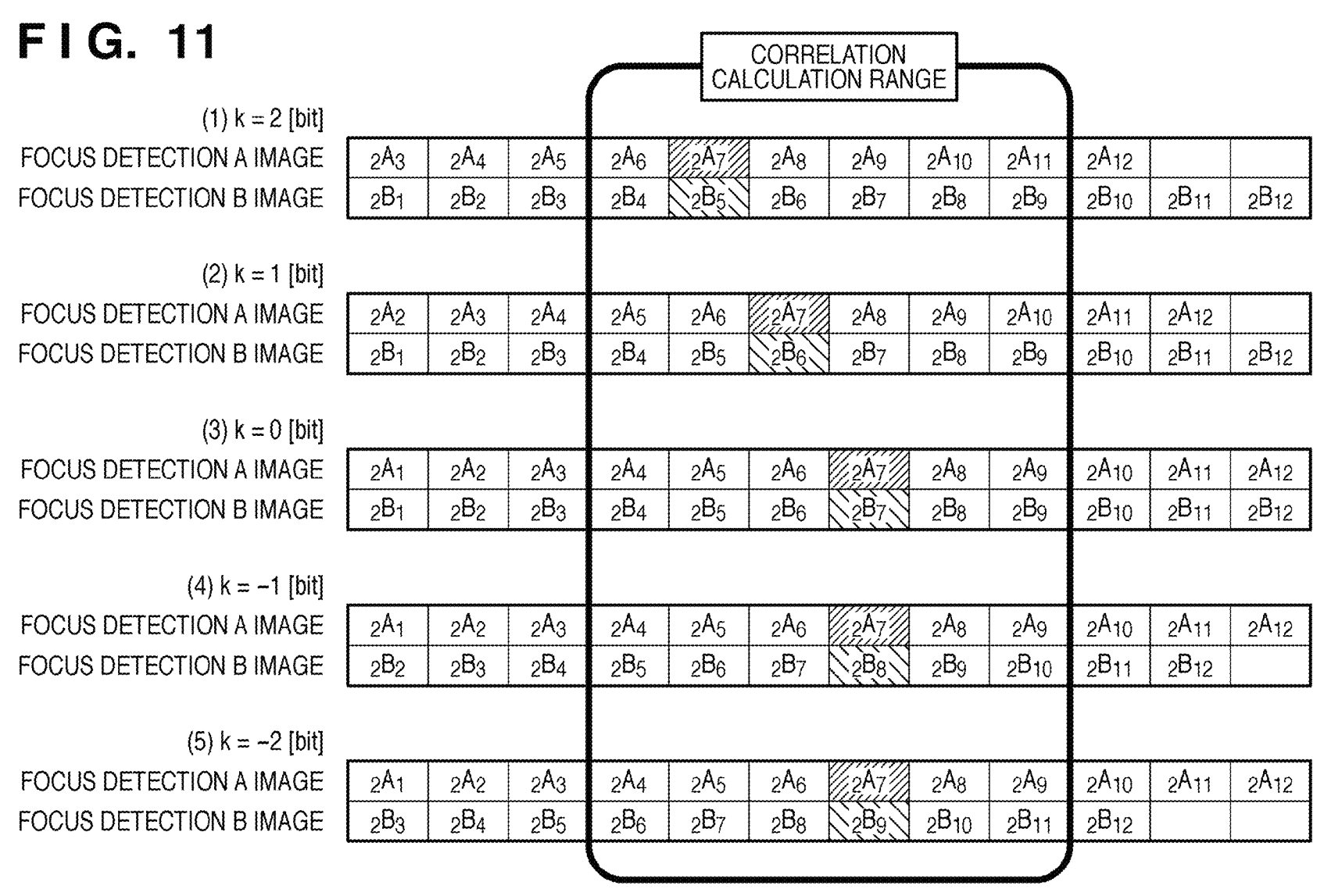

FIG. 11 is a view schematically showing the state of line images when performing a correlation calculation. In FIG. 11, the parameters are as follows: i=2, j=4, 5, . . . , and 9, and k=−2, −1, 0, 1, and 2. As clearly seen from FIG. 11, a pixel that opposes the defective pixel (2A7) changes as follows: 2B5, 2B6, 2B7, 2B8, and then 2B9 for each image shift. In the present invention, the defective pixel (2A7) and the pixel that opposes the defective pixel are interpolated for each image shift. In the present invention, this method is defined as a method in which "pairs of pixels that oppose each other are generated". As an interpolation method, for example, in the case where iAj is a defective pixel, the following equation (2) is given.

$$_iA_j = (_iA_{j-1} + {_iA_{j+1}})/2 \quad (2)$$

Here, the same can be applied to iBj. In FIG. 11, 2A7 is always defective, and, thus, 2A7=(2A6+2A8)/2 regardless of the image shift amount. Accordingly, correction is performed in S193 of the correlation calculation subroutine. Conversely, an image that opposes the defective pixel changes as follows: 2B5=(2B4+2B6)/2 when k=2 [bit], and 2B6=(2B5+2B7)/2 when k=1 [bit]. Thus, in S197 of the correlation calculation subroutine, pixels that oppose the defective pixel 2A7 according to the image shift amount are sequentially interpolated and given. Here, as another equation for correction, for example, the following equations (3) and (4) also can be used.

$$_iA_j=(_{i-1}A_j+_{i+1}A_j)/2 \quad (3)$$

$$_iA_j=(_iA_{j-1}+_iA_{j+1}+_{i-1}A_j+_{i+1}A_j)/4 \quad (4)$$

The equation (2) shows an example of an equation for performing interpolation in the pupil division direction, the equation (3) shows an example of an equation for performing interpolation in a direction that is perpendicular to the pupil division, and the equation (4) shows an example of an equation for performing interpolation in two dimensions. Since the present invention exhibits characteristics typically in the timing and the target of interpolation, any equation for correction may be used.

Returning to FIG. 9, the subsequent portions of the correlation calculation subroutine will be described. After the loop processing (S199 to S203) for performing calculation in the focus detection viewing field, in S205, the CPU 20 stores the correlation amount with respect to the image shift amount in a memory such as a RAM. In the loop processing for the image shift amount in S195 to S207, the CPU 20 calculates the correlation amount in a prescribed image shift range.

Then, in S208, the CPU 20 determines a pixel that opposes the defective pixel in a focus detection pixel group based on the correlation amount obtained in the loop in S195 to S207. That is to say, in S208, before the interpolation in S209 described below, a pixel in the B pixel group that opposes the defective pixel in the A pixel group is determined using the focus detection pixels. More specifically, according to the definition of the equation (1), when the correlation is high (two images substantially match each other), the correlation amount COR is at a minimum, and, thus, the value of k at which the correlation amount is at a minimum is obtained. More specifically, as shown in FIG. 11, a pixel that opposes the defective pixel 2A7 is selected from among 2B5, 2B6, 2B7, 2B8, and 2B9.

Then, in S209, the CPU 20 performs correction processing (interpolation processing) on the pixel that opposes the defective pixel determined in S208. More specifically, a method in the correction processing is similar to the correction method using the equations (2) to (4) above. For example, in the case where the value of k at which the correlation amount is at a minimum is 1, the pixel 2B6 that opposes the defective pixel is corrected (interpolated) as (2B5+2B7)/2 using the equation (2). More specifically, interpolation is performed based on the values of focus detection pixels that are of the same type in the B pixel group and that are not the defective pixel.

Then, in S211, the CPU 20 performs digital filter processing. The digital filter in S211 may be any filter having an appropriate shape according to a frequency of interest or the like in the focus detection. Then, in S213 to S223, the CPU 20 performs loop processing for the image shift amount that calculates the correlation amount again using the image on which correction processing is performed in S209. Here, the image shift amount in S213 to S223 does not have to be the same as that in S195 to S207, and the calculation need only be performed using a value that is close to the value of k at which the correlation amount is at a minimum in S209.

In the loop processing for the image shift amount, the CPU 20 calculates the correlation amount in the focus detection viewing field in the viewing field loop in S215 to S219. More specifically, in S217, the CPU 20 calculates the correlation amount according to the equation (1) and the like. Here, the defective pixel is corrected in S193 and the pixel that opposes the defective pixel is corrected in S209, and, thus, correction processing is not performed between S215 and S217.

Figure 12:
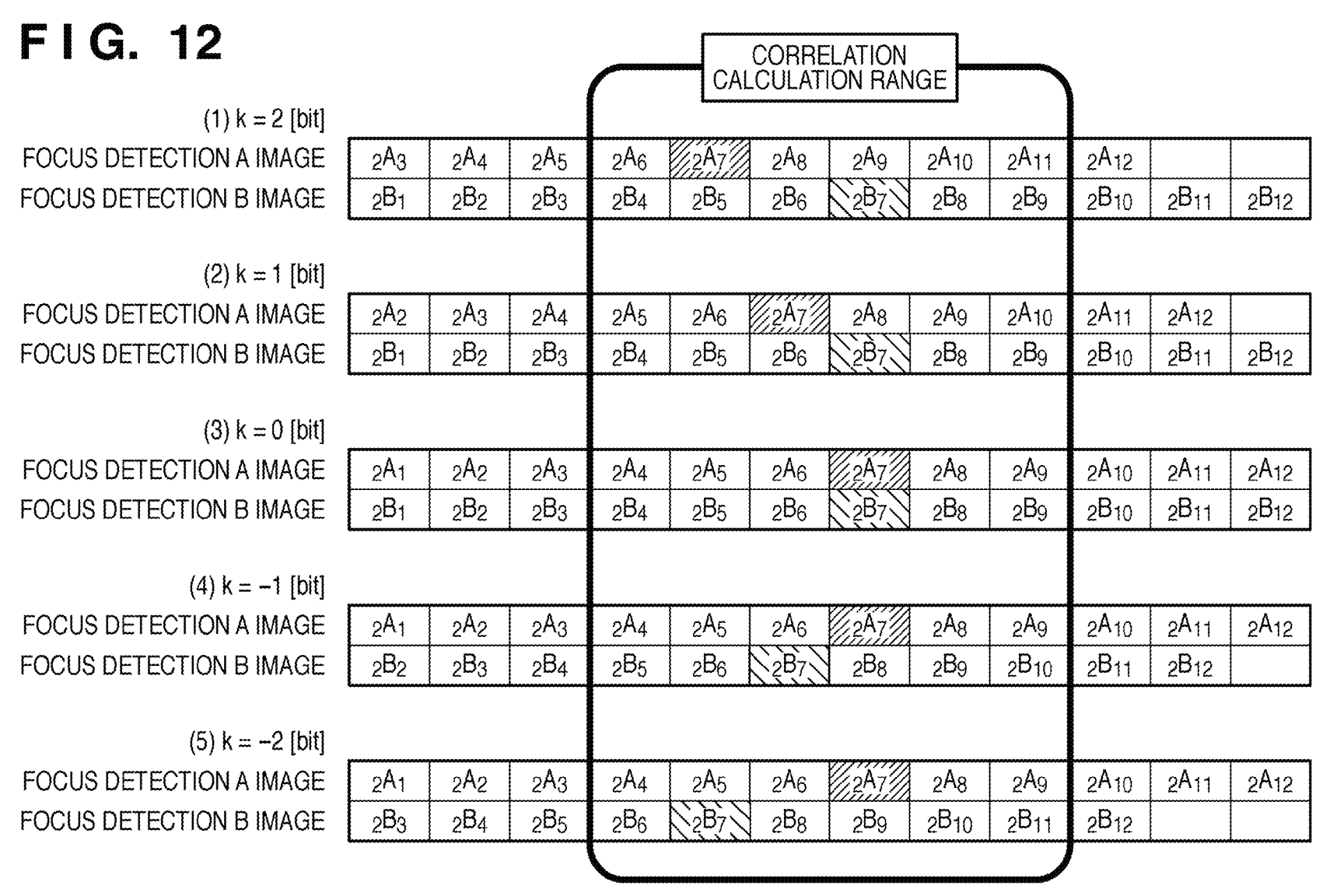

FIG. 12 schematically shows a state in which the correlation amount is calculated again as described above. FIG. 12 shows the case in which, in S209, the value of k at which the correlation amount is at a minimum is 0, and processing is performed assuming that 2A7 and 2B7 oppose each other. As shown in FIG. 12, 2B7 on which correction processing is performed in S209 is used for a correlation calculation without being subjected to correction processing during the image shift. Then, in S221, the CPU 20 stores the correlation amount calculated in the viewing field loop.

Then, in S225, the CPU 20 determines the predicted amount. More specifically, the CPU 20 determines the value of k at which the correlation between the line image of the A pixel group and the line image of the B pixel group is at a maximum, based on the correlation amount obtained in S217. Then, in S227, the CPU 20 returns the procedure to S139 of the focus detection subroutine shown in FIG. 8.

Returning to FIG. 8, the subsequent portions of the focus detection subroutine will be described. After S139, in S141, the CPU 20 judges the reliability of the correlation calculation results. Here, "reliability" refers to the degree of a match between two images (the line image of the A pixel group and the line image of the B pixel group), and in the case where the degree of a match between two images is high, generally, the reliability of the focus detection results is high. Thus, in the case where a plurality of focus detection regions are selected, information with high reliability is preferentially used based on the judgment results in S141.

Then, in S143, the CPU 20 calculates the focus shift amount from the detect results with high reliability in S141. Then, in S145, the CPU 20 returns the procedure to S151 of the main process shown in FIG. 7.

Returning to FIG. 7, the subsequent portions of the main process will be described. In S151, the CPU 20 judges whether or not the focus shift amount calculated in S143 of FIG. 8 is less than a preset tolerance, and in-focus status is obtained. If it is judged that the focus shift amount is the tolerance or more, and in-focus status is not obtained, in S153, the CPU 20 drives the focus lens of the imaging lens 5, and then returns the procedure to S131. Accordingly, in the camera 1, the processing from S131 to S151 is repeatedly performed until it is judged that in-focus status is obtained.

If it is judged that the focus shift amount is less than the tolerance, and in-focus status is obtained, in S155, the CPU 20 causes a display portion (not shown) such as an LCD to perform in-focus display indicating that in-focus status is obtained, and causes the procedure to proceed to S157.

Then, in S157, the CPU 20 judges whether or not an imaging start switch (not shown) is turned on, and, if the switch is not turned on, the procedure proceeds to S159. In S159, the CPU 20 judges whether or not the imaging preparation switch is turned on, and judges whether or not to maintain imaging standby status. Here, if imaging standby status is to be maintained, the CPU 20 returns the procedure again to S157. Furthermore, if imaging standby status is to be canceled, the CPU 20 returns the procedure to S105 where a preview operation and the like is performed.

Figure 13:
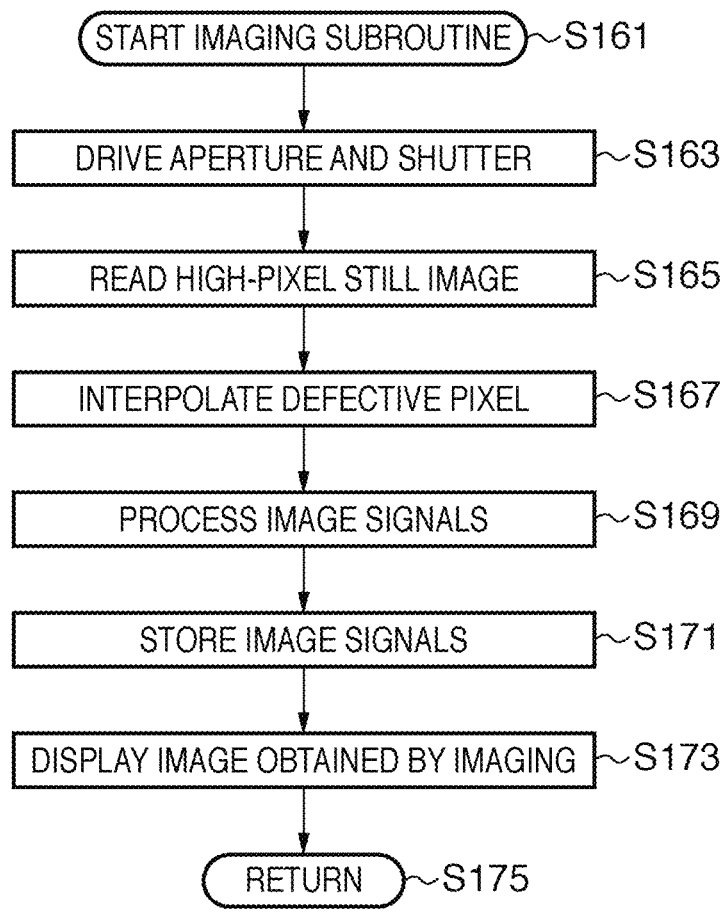
FIG. 13 is a flowchart showing an imaging subroutine according to the first embodiment.

If the imaging start switch is turned on in S157, the CPU 20 causes the procedure to proceed to S161 where an imaging subroutine is executed. FIG. 13 is a flowchart showing the imaging subroutine.

As shown in FIG. 13, if the imaging start switch is turned on, in S161, the CPU 20 starts the imaging subroutine process, and, in S163, drives an aperture for adjusting the amount of light and controls the opening of a mechanical shutter that regulates the exposure time. Here, the shutter may be driven such that the shutter runs again after the shutter is closed once, or the shutter may run so that the shutter is closed after a reset operation is electrically performed.

Then, in S165, the CPU 20 reads an image for imaging a high-pixel still image, that is, reads all pixels of the image sensor 10. Then, in S167, the CPU 20 interpolates a defective pixel of the read image signal. Output of the focus detection pixel in the image sensor 10 does not have RGB color information for imaging, and corresponds to a defective pixel when obtaining a still image. Accordingly, in the interpolation of a defective pixel, interpolation is performed from information on imaging pixels having RGB color information positioned around the focus detection pixel, and, thus, an image signal corresponding to the focus detection pixel is generated.

Then, in S169, the CPU 20 performs image processing such as γ-correction of an image or edge enhancement, and, in S171, stores the image obtained by imaging in a storage medium (not shown) such as a semiconductor memory. Then, in S173, the CPU 20 displays the image obtained by imaging on the above-described display portion, and, in S175, returns the procedure to the main process shown in FIG. 7. As shown in FIG. 7, when the procedure returns from the imaging subroutine, in S181, the CPU 20 ends the series of imaging operations.

Figure 14A:
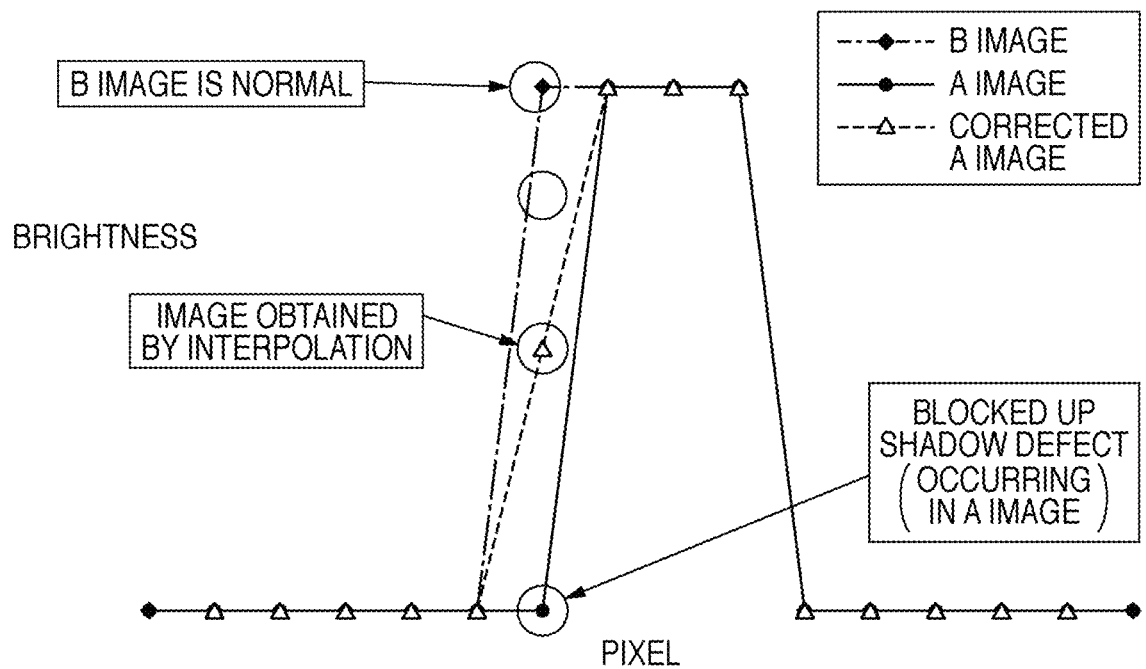
Figure 14B:
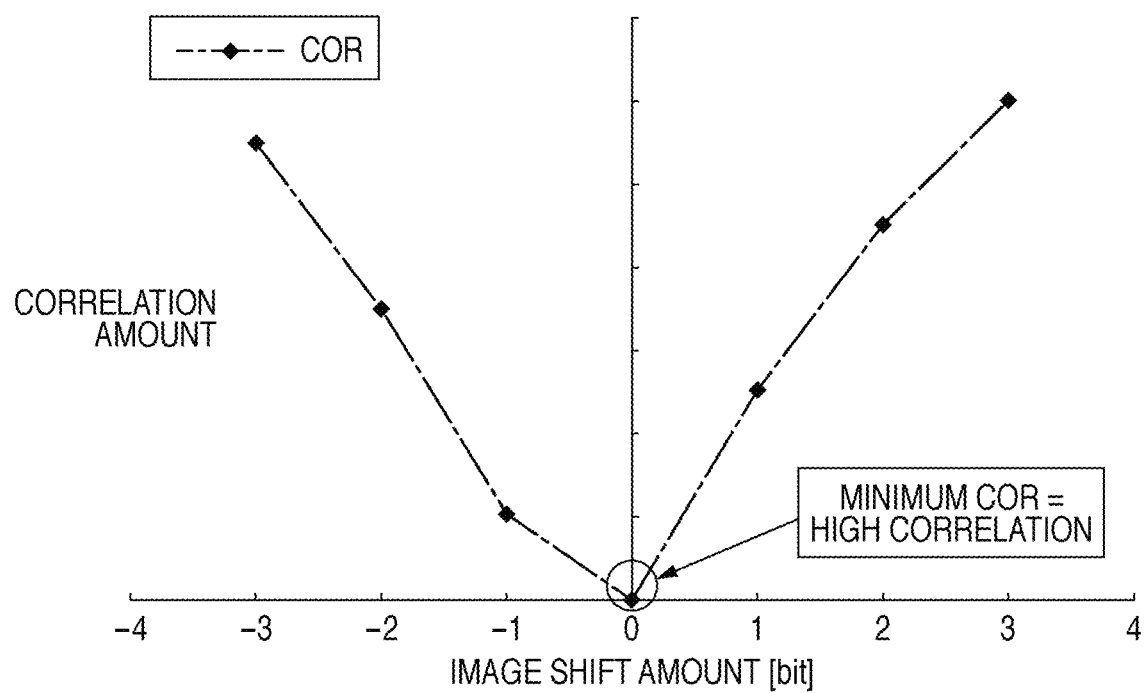

Here, the effect obtained by the above-described processing will be described with reference to FIGS. 14A to 16B. Here, FIG. 14A is a graph showing the relationship between line images obtained by focus detection pixel groups and brightness. FIG. 14B is a graph showing the correlation amount obtained by calculation using the signals of the focus detection pixel groups exemplified in FIG. 14A. Here, in FIG. 14A, the horizontal axis indicates the position of a focus detection pixel, and the vertical axis indicates brightness. That is to say, the example of FIG. 14A exemplifies the case in which there is an object having high brightness near the center, and the surrounding portions are dark. In the case where the focus detection pixels have no defect, the same signal is allocated both to the A image and the B image, but, in the example of FIG. 14A, a signal for one pixel of the A image is missing due to a defect. At that time, if there are none missing, the correlation amount is at a minimum when the image shift amount=0 bit.

In this embodiment, signals as shown in FIG. 14A are obtained in the case where there is an object that is in-focus and that has high brightness at the center, and the surrounding portions are dark. The influence of a defective pixel on focus detection varies depending on the positional relationship between the defect and the object, but, as a case in which the influence of the defect is greatest, FIG. 14A exemplifies the case in which an edge portion of the central object having high brightness and a defective pixel overlap each other. On the contrary, even if a defect such as a blocked up shadow is present at a dark position, there is no influence on focus detection.

In FIG. 14B, the horizontal axis indicates the image shift amount (corresponding to k described above), and the vertical axis indicates the correlation amount obtained based on the equation (1) and the equation (2) described above. In the above-described flowchart, the correlation amount is obtained in S195 to S207 shown in FIG. 9. In FIG. 14B, the correlation amount (COR) is at a minimum when the image shift amount=0 bit. As described above, in this embodiment, in the focus detection pixels, a pair of a defective pixel and a pixel that opposes the defective pixel are respectively interpolated from the nearby pixels using the equation (2).

Accordingly, in this embodiment, if there is no noise at a position where images match each other (0 bit in the example in FIGS. 14A and 14B), the correlation amount=0 (i.e., the correlation is high). At this position, the A image and the B image obtained by the focus detection pixel groups match each other, and it is judged that the correlation is highest. In the above-described flowchart, the operation that determines a position at which the correlation is at a maximum, and determines a defective pixel and a pixel that opposes the defective pixel is performed in S208.

Figure 15A:
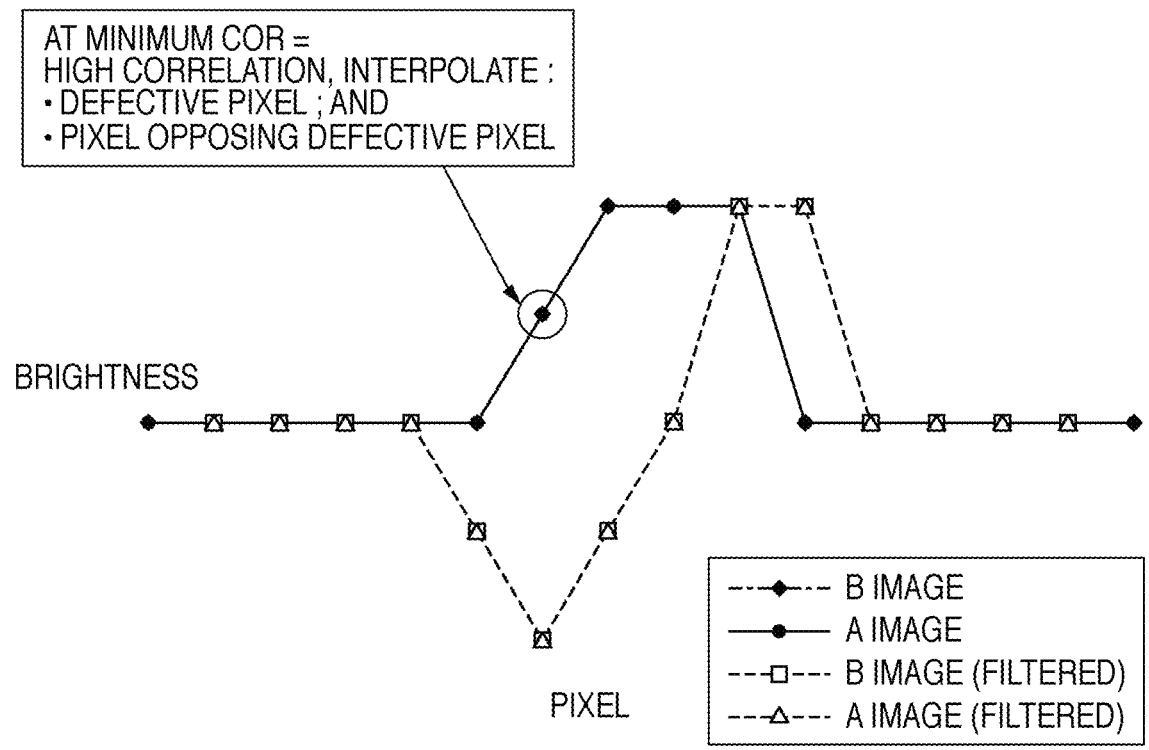
Figure 15B:
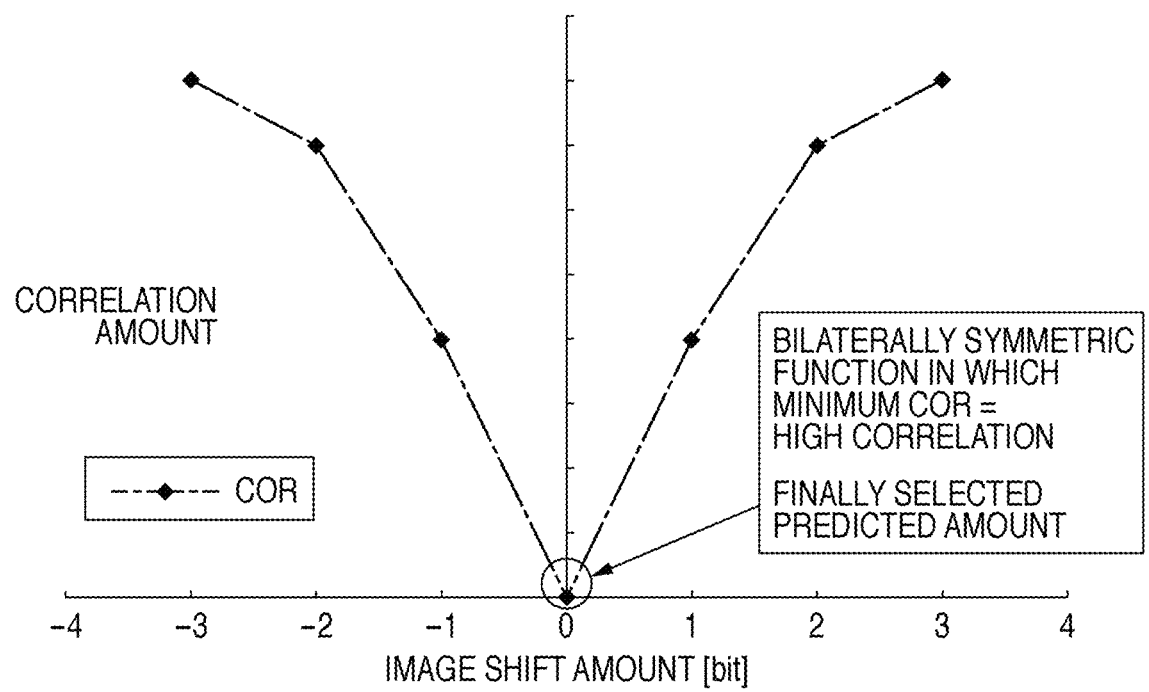

FIG. 15A is a graph showing the relationship between line images obtained by focus detection pixel groups, and line images on which digital filter processing has been performed after correction of a defective pixel and a pixel that opposes the defective pixel in S209. FIG. 15B is a graph showing the correlation amount obtained by calculation using the signals of the focus detection pixel groups exemplified in FIG. 15A. Here, in FIG. 15A, the horizontal axis indicates the position of a focus detection pixel, and the vertical axis indicates brightness. Since the correction processing on a defective pixel and a pixel that opposes the defective pixel for both the A image and the B image is completed in S209, as shown in FIG. 15A, two line images completely match each other.

In FIG. 15B, the horizontal axis indicates the image shift amount (corresponding to k described above), and the vertical axis indicates the correlation amount (COR) obtained based on the equation (1) and the equation (2) described above. As shown in FIG. 15A, line images, which form a pair, completely match each other, and, thus, in the graph shown in FIG. 15B, the correlation amount is at a minimum (i.e., the correlation is high) when the image shift amount=0 bit. Accordingly, the image shift amount at which the COR is at a minimum in the graph is finally selected as the predicted amount at the time of focus detection.

Figure 16A:
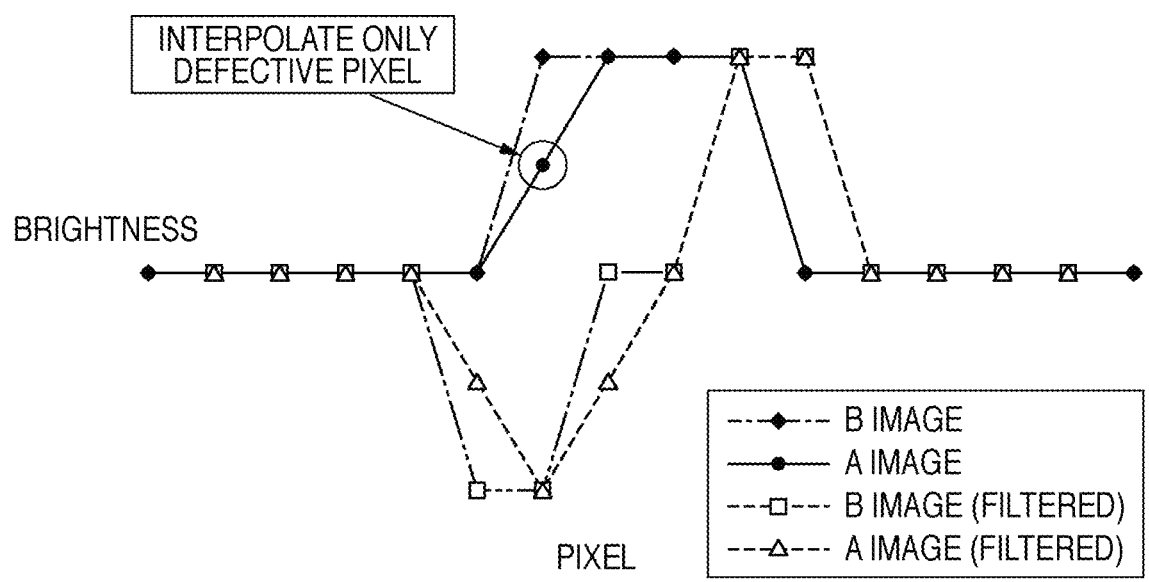
Figure 16B:
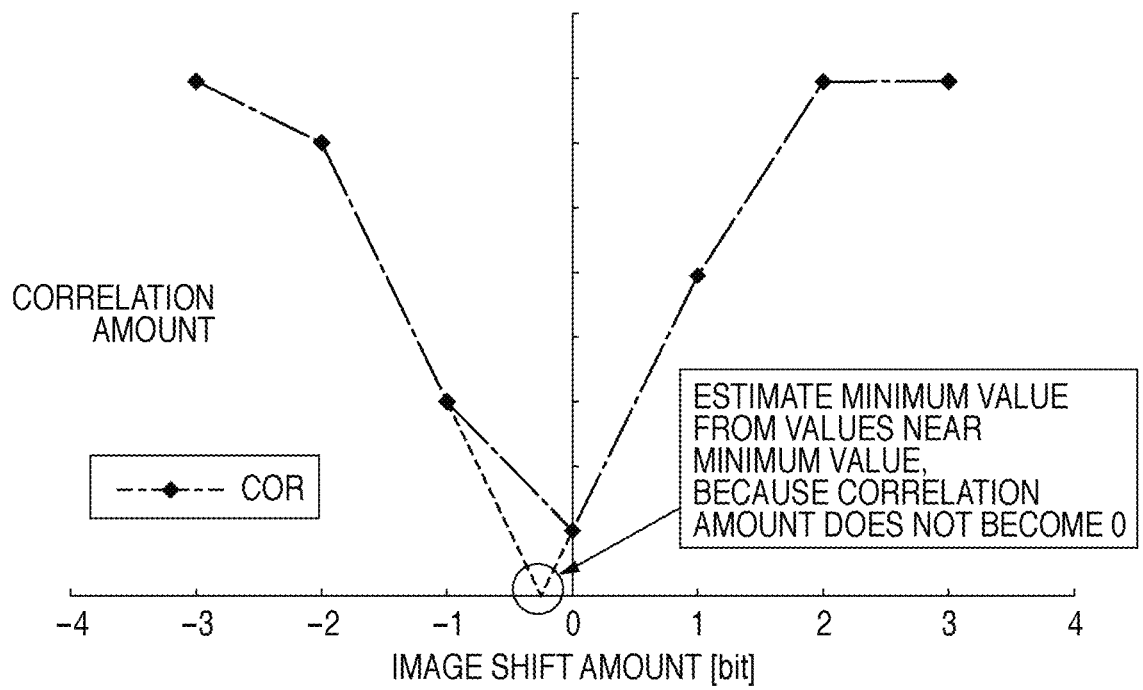

Here, FIGS. 16A and 16B show the results of interpolation processing only on a defective pixel of a focus detection pixel group in order to more clearly show the effect obtained by calculating the correlation amount again after interpolation of a defective pixel and a pixel that opposes the defective pixel of a focus detection pixel group. FIG. 16A is a graph showing the relationship between line images obtained by focus detection pixel groups and line images on which digital filter processing has been performed after correction of only a defective pixel, and brightness. FIG. 16B is a graph showing the correlation amount obtained by calculation using the signals of the focus detection pixel groups exemplified in FIG. 16A.

As shown in FIG. 16A, in the case where interpolation processing is performed only on a defective pixel, line images, which form a pair, do not match each other. Thus, as shown in FIG. 16B, the graph curve showing the correlation amount is asymmetric, and the bottom of the shape is not completely lowered. Accordingly, in the case where this sort of correlation amount is obtained, as shown in FIG. 16B, the value of k at which COR (k) is at a minimum (COR=0) is estimated, for example, using a method in which tangent lines from both sides of the point of inflection of the graph are extended. Here, the method for estimating the value of k may be a method in which the local minimum value is obtained using an appropriate function for approximation to the curve of a graph of the correlation amount.

However, in the case of k obtained in the above-described estimation, k=0 is not obtained although an image is in-focus. That is to say, even when an image is in-focus, it may be judged that the image is out-of-focus, and erroneous focus detection may be performed, and, as a result, an out-of-focus image obtained by imaging in which the image is out-of-focus is acquired. However, in this embodiment, the influence of a defective pixel contained in a focus detection pixel group can be reduced by performing the processing on a defect regarding focus detection pixel groups according to the above-described simple algorithm (flow). Accordingly, the camera 1 can provide a user with an accurate in-focus image obtained by imaging. Furthermore, since a defective pixel in a focus detection pixel group in the image sensor 10 can be allowed, the yield of the image sensor 10 increases, and the cost can be reduced.

Second Embodiment

FIGS. 17 to 21B are views illustrating a second embodiment. Hereinafter, the second embodiment will be described with reference to these drawings. Here, this embodiment is similar to the first embodiment except for the calculation of a correlation, and, thus, a description of constituent elements similar to those in the first embodiment, such as the configuration of the camera 1, is omitted, and only constituent elements different from those in the first embodiment will be described.

In this embodiment, the main process is as shown in FIG. 7, the focus detection subroutine is as shown in FIG. 8, and the imaging subroutine is as shown in FIG. 13. A correlation calculation subroutine different from that in the first embodiment is shown in FIG. 17.

Figure 17:
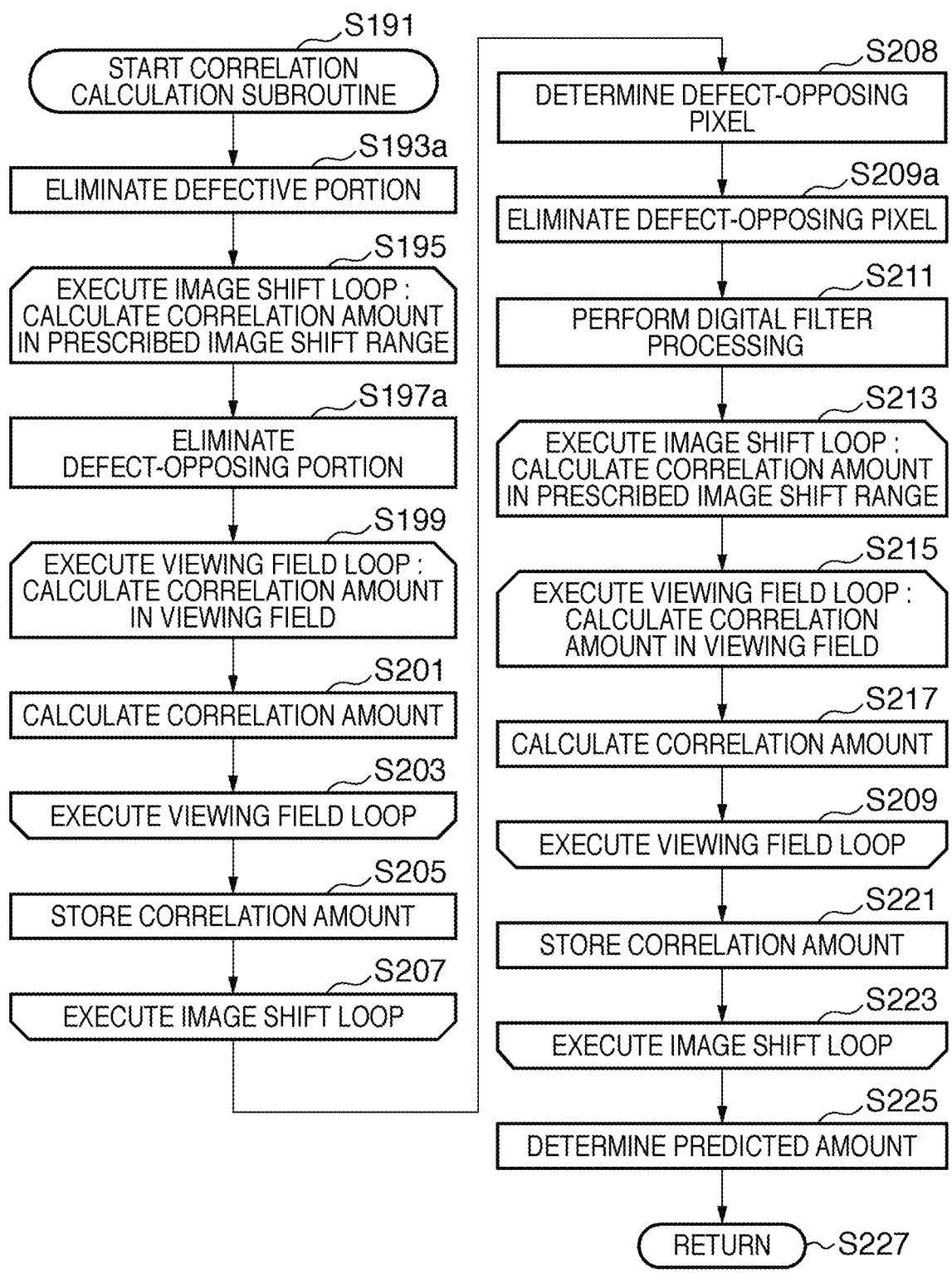
FIG. 17 is a flowchart showing a correlation calculation subroutine according to a second embodiment.

As shown in FIG. 17, the second embodiment is different from the first embodiment in that, in S193a, elimination processing is performed on a defective portion (defective pixel) in a focus detection pixel group based on the defect information obtained in S137 of the focus detection subroutine. Here, "elimination processing" refers to an operation that eliminates a defective portion before performing calculation so as not to use the defective portion for detecting the focusing status. Here, a specific processing method will be described later.

Furthermore, S195 to S207 form a processing loop for the image shift amount. In S197a, elimination processing is performed that eliminates a pixel that opposes the defective pixel based on the defect information obtained in S137 of the focus detection subroutine, so as not to use the pixel for detecting the focusing status, at a position obtained after the image shift.

FIG. 18 is a view schematically showing the state of the A image and the B image that are focus detection images obtained by the focus detection pixel groups when performing a correlation calculation. FIG. 18 shows a state after elimination processing on a defective pixel. In FIG. 18, in order to clearly show pixels eliminated from the calculation as a result of elimination processing, eliminated pixels are indicated on the right.

As clearly seen from FIG. 18, a pixel that opposes the defective pixel 2A7 changes as follows: 2B5, 2B6, 2B7, 2B8, and then 2B9 for each image shift. In this embodiment, the defective pixel 2A7 and a pixel that opposes the defective pixel are eliminated for each image shift, and, thus, the influence thereof on the correlation calculation is prevented. In the present invention, this method is defined as a method in which "focus detection images are generated in which a pair of a defective pixel and a pixel that opposes the defective pixel is eliminated".

In FIG. 18, 2A7 is always defective, and, thus, the A image is processed such that this pixel is eliminated regardless of the image shift amount, and 2A6 is disposed directly before 2A8.

Thus, elimination processing is performed in S193a of the correlation calculation subroutine.

Conversely, an image that opposes the defective pixel is 2B5 when k=2 [bit], and, thus, the B image is processed such that 2B4 is disposed directly before 2B6. Furthermore, an image that opposes the defective pixel is 2B6 when k=1 [bit], and, thus, the B image is processed such that 2B5 is disposed directly before 2B7. That is to say, the processing method for the B image varies depending on the image shift. Thus, in the elimination processing in S197a of the correlation calculation subroutine, a pixel that opposes the defective pixel 2A7 according to the image shift amount is eliminated, and, thus, the B image is provided.

As in the first embodiment, S199 to S203 of the correlation calculation subroutine form a viewing field loop that performs calculation in the focus detection viewing field. Furthermore, in S205, the correlation amount with respect to the image shift amount is stored in a memory. In the loop processing for the image shift amount in S195 to S207, calculation of the correlation amount in a prescribed image shift range is performed.

As in the first embodiment, in S208, based on the correlation amount obtained in the loop in S195 to S207, a pixel that opposes the defective pixel in a focus detection pixel group is determined before elimination in S209a, which will be described later. More specifically, according to the definition of the equation (1), when the correlation is high (two images substantially match each other), the correlation amount COR is at a minimum, and, thus, the value of k at which the correlation amount is at a minimum is obtained. For example, a pixel that opposes the defective pixel 2A7 is selected from among 2B5, 2B6, 2B7, 2B8, and 2B9. Then, in S209a, the CPU 20 eliminates the pixel determined in S208.

The processing in S211 and thereafter performed by the CPU 20 is similar to that in the first embodiment. More specifically, in S211, digital filter processing is performed. The digital filter in S211 may be any filter having an appropriate shape according to a frequency of interest or the like in the focus detection. Then, S213 to S223 form an image shift loop that calculates the correlation amount again using the image in which a pixel that opposes the defective pixel is eliminated in S209a. Here, the image shift amount in S213 does not have to be the same as that in S195, and the calculation need only be performed using a value that is close to the value of k at which the correlation amount is at a minimum in S209a.

In the viewing field loop in S215 to S219, the correlation amount is calculated in the focus detection viewing field. The defective pixel is eliminated in S193a and the pixel that opposes the defective pixel is eliminated in S209a, and, thus, elimination processing is not performed between S215 and S217.

FIG. 19 schematically shows a state in which the correlation amount is calculated again as described above. FIG. 19 shows the case in which, in S209a, the value of k at which the correlation amount is at a minimum is 0, and processing is performed assuming that 2A7 and 2B7 oppose each other. As shown in FIG. 19, 2B7 is eliminated in S209a, and is not used when calculating the correlation amount again. The correlation amount calculated in the viewing field loop is stored in S221, and the predicted amount is determined in S225. More specifically, based on the correlation amount obtained in S217, the value of k at which the correlation between the line image of the A pixel group and the line image of the B pixel group is at a maximum is determined. Then, in S227, the procedure returns to S139 of the focus detection subroutine shown in FIG. 8.

Figure 20B:
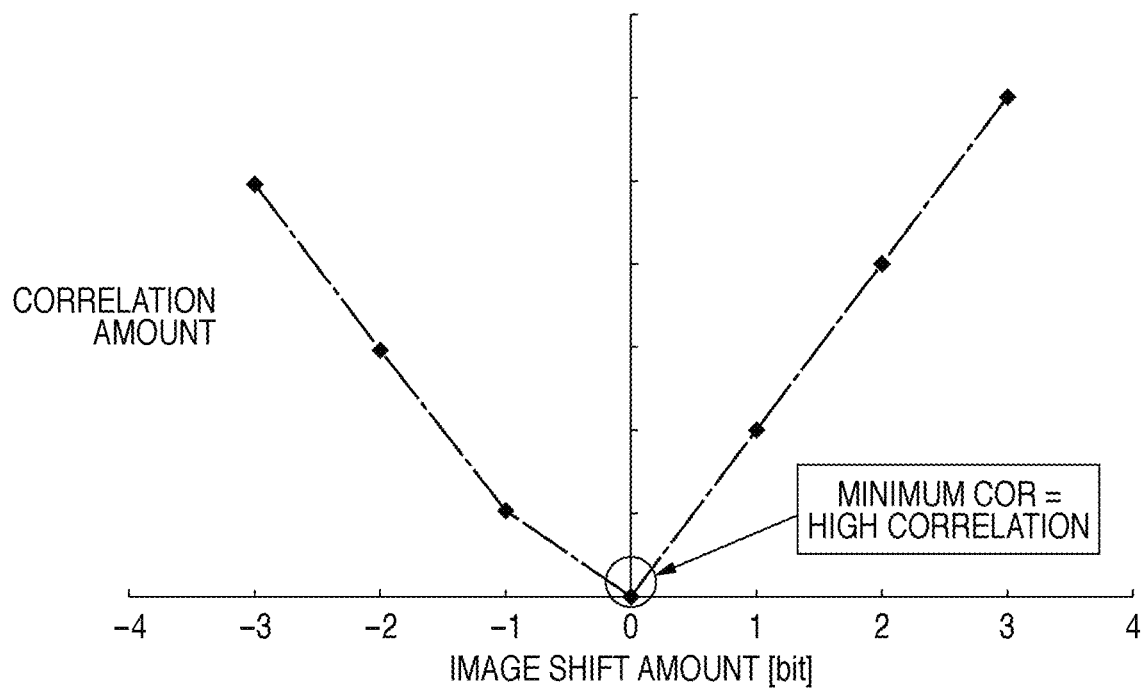

Here, the effect obtained by the above-described processing will be described with reference to FIGS. 20A and 20B, and 21A and 21B. Here, signals from focus detection pixel groups for an object, the brightness thereof, the position of a defective pixel, and the like are the same as those in the first embodiment exemplified in FIGS. 14A and 14B. FIGS. 20A and 20B are graphs showing focus detection images and the correlation amount thereof when initially obtaining the correlation amount, wherein FIG. 20A is a graph showing the relationship between line images obtained by focus detection pixel groups and brightness after elimination processing. Furthermore, FIG. 20B is a graph showing the correlation amount obtained by calculation using the signals of the focus detection pixel groups exemplified in FIG. 20A. Here, in FIG. 20A, the horizontal axis indicates the position of a focus detection pixel, and the vertical axis indicates brightness.

The signals based on which FIG. 20A is formed are signals in which only the A image has a defect at a position where the brightness of an object changes as shown in FIG. 14A. Conversely, the signals shown in FIG. 20A are signals in which elimination processing has been performed at a position where two images are correctly superimposed on each other. Accordingly, when portions having high brightness are compared in FIG. 14A and FIG. 20A, the portion in FIG. 20A is shorter than the other due to elimination processing. Furthermore, as shown in FIG. 20A, since a defective pixel and a pixel that opposes the defective pixel are eliminated, when images are correctly superimposed on each other, signals of other pixels completely match each other, and the correlation between the two images is calculated to be high.

In FIG. 20B, the horizontal axis indicates the image shift amount, and the vertical axis indicates the correlation amount obtained based on the equation (1) described above. In the above-described flowchart, the correlation amount is obtained in S195 to S207 shown in FIG. 17. In FIG. 20B, the correlation amount (COR) is at a minimum when the image shift amount=0 bit. Furthermore, in this embodiment, image signals from a pair of a defective pixel and a pixel that opposes the defective pixel of a focus detection pixel group are eliminated so as not to be used, and the correlation amount for the focus detection images after elimination is calculated.

Accordingly, in this embodiment, if there is no noise at a position where images match each other (0 bit in the example in FIG. 20B), the correlation amount=0 (i.e., the correlation is high). At this position, the A image and the B image obtained by the focus detection pixel groups completely match each other, and it is judged that the correlation is highest. In the above-described flowchart, the operation that determines a position at which the correlation is at a maximum, and determines a defective pixel and a pixel that opposes the defective pixel is performed in S209a.

Figure 21A:
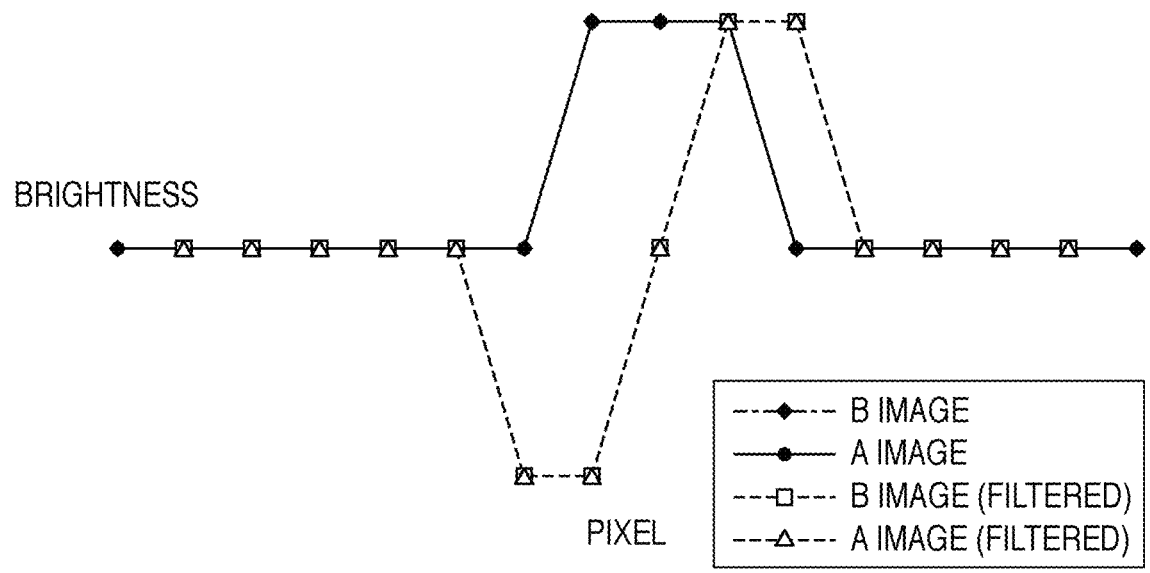
Figure 21B:
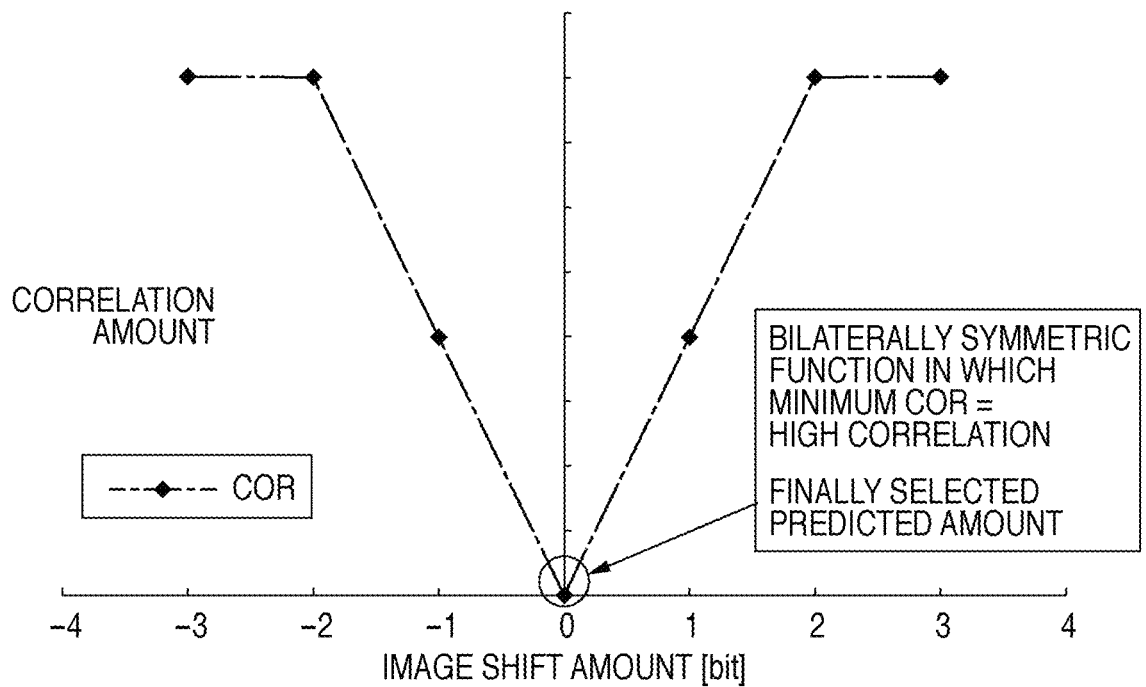

FIG. 21A is a graph showing the relationship between line images obtained by focus detection pixel groups and line images on which digital filter processing has been performed after a defective pixel and a pixel that opposes the defective pixel are eliminated in S209a, and brightness. FIG. 21B is a graph showing the correlation amount obtained by calculation using the signals of the focus detection pixel groups exemplified in FIG. 21A. Here, in FIG. 21A, the horizontal axis indicates the position of a focus detection pixel, and the vertical axis indicates brightness. Since the elimination processing on a defective pixel and a pixel that opposes the defective pixel for both the A image and the B image is completed in S209a, as shown in FIG. 21A, two line images completely match each other.

In FIG. 21B, the horizontal axis indicates the image shift amount, and the vertical axis indicates the correlation amount obtained based on the equation (1) described above. As shown in FIG. 21A, line images, which form a pair, completely match each other, and, thus, in the graph shown in FIG. 21B, the correlation amount is at a minimum (i.e., the correlation is high) when the image shift amount=0 bit. Accordingly, the image shift amount at which the correlation amount COR is at a minimum in the graph is finally selected as the predicted amount at the time of focus detection.

In this embodiment, the influence of a defective pixel contained in a focus detection pixel group can be reduced by performing the processing on a defect (elimination processing) regarding focus detection pixel groups according to the above-described simple algorithm (flow). Accordingly, the camera 1 can provide a user with an accurate in-focus image obtained by imaging. Furthermore, a defective pixel can be allowed in focus detection pixel groups in the image sensor 10, and, thus, the yield of the image sensor 10 increases, and the cost can be reduced.

Third Embodiment

Figure 22:
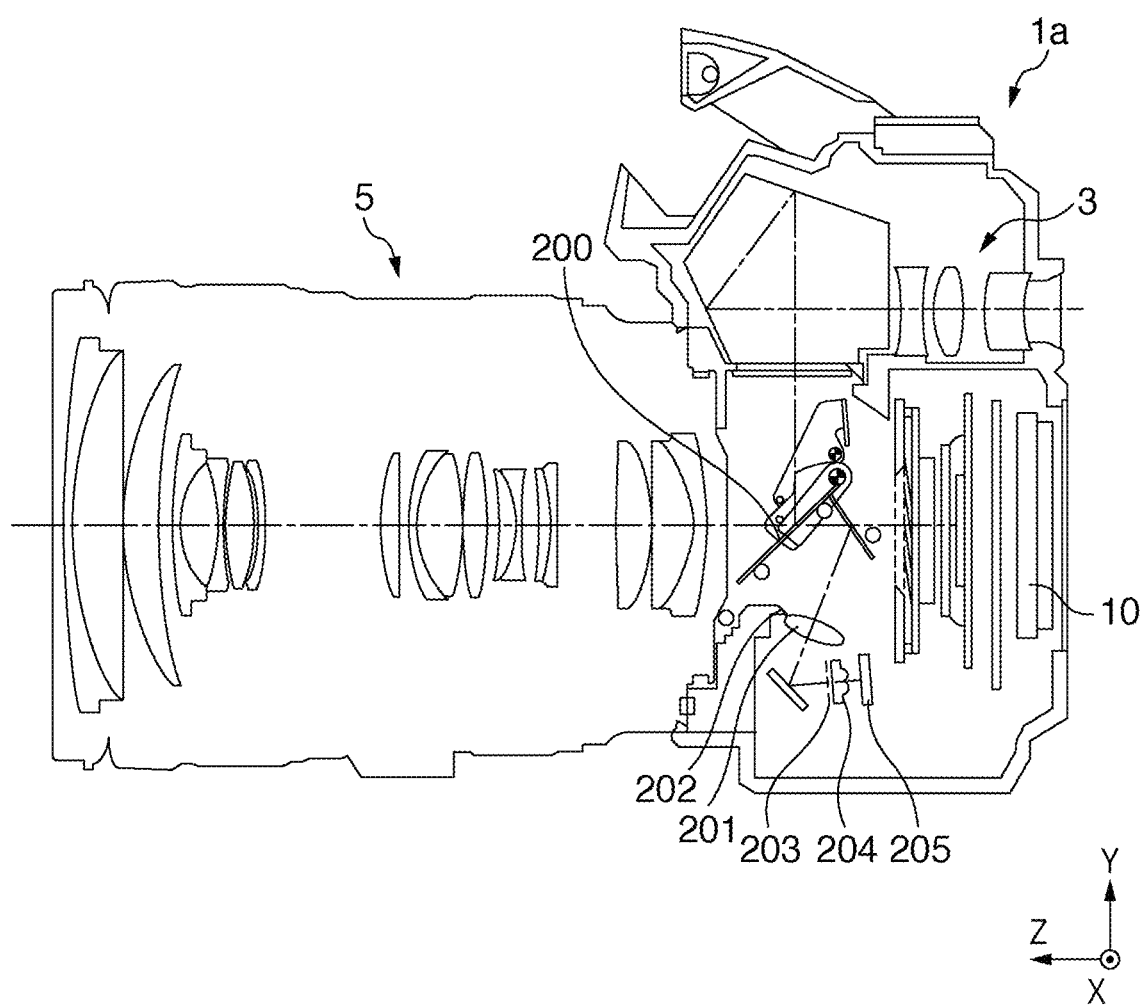
FIG. 22 is a view schematically showing the configuration of a camera according to a third embodiment.
Figure 23:
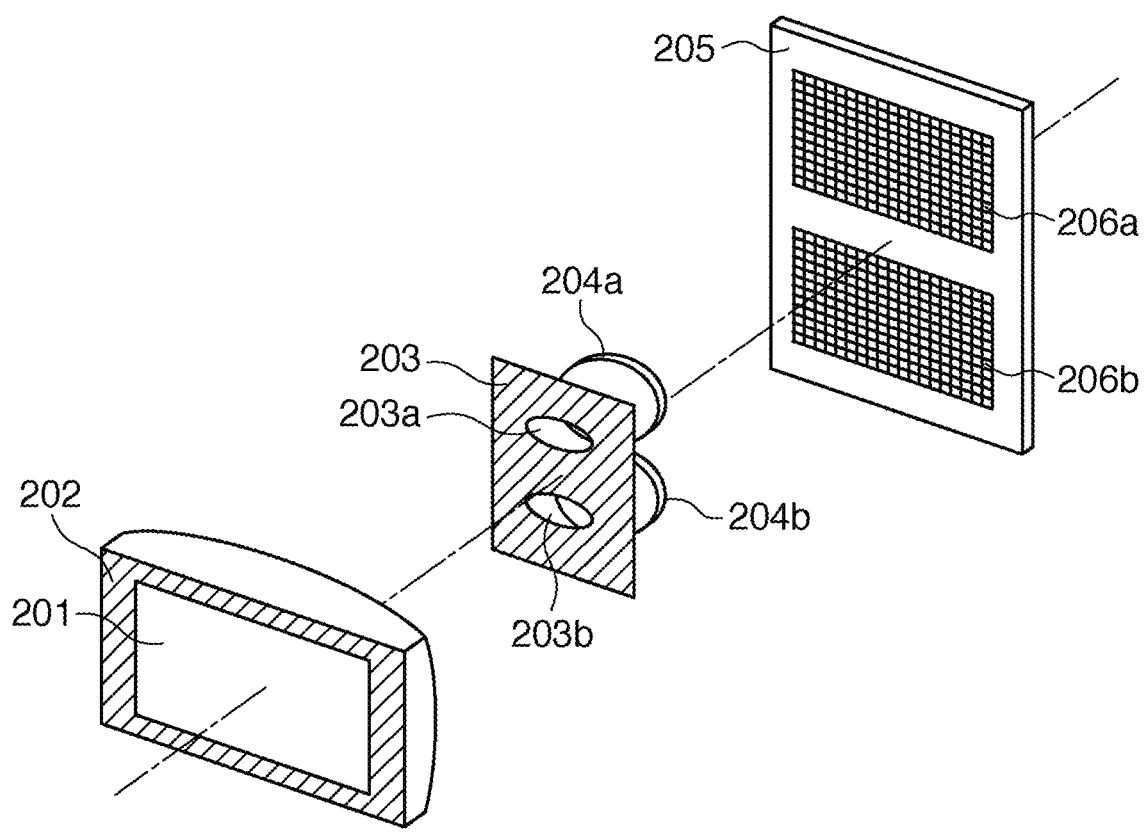
FIG. 23 is a view showing the configuration of a pupil division means according to the third embodiment.
Figure 24:
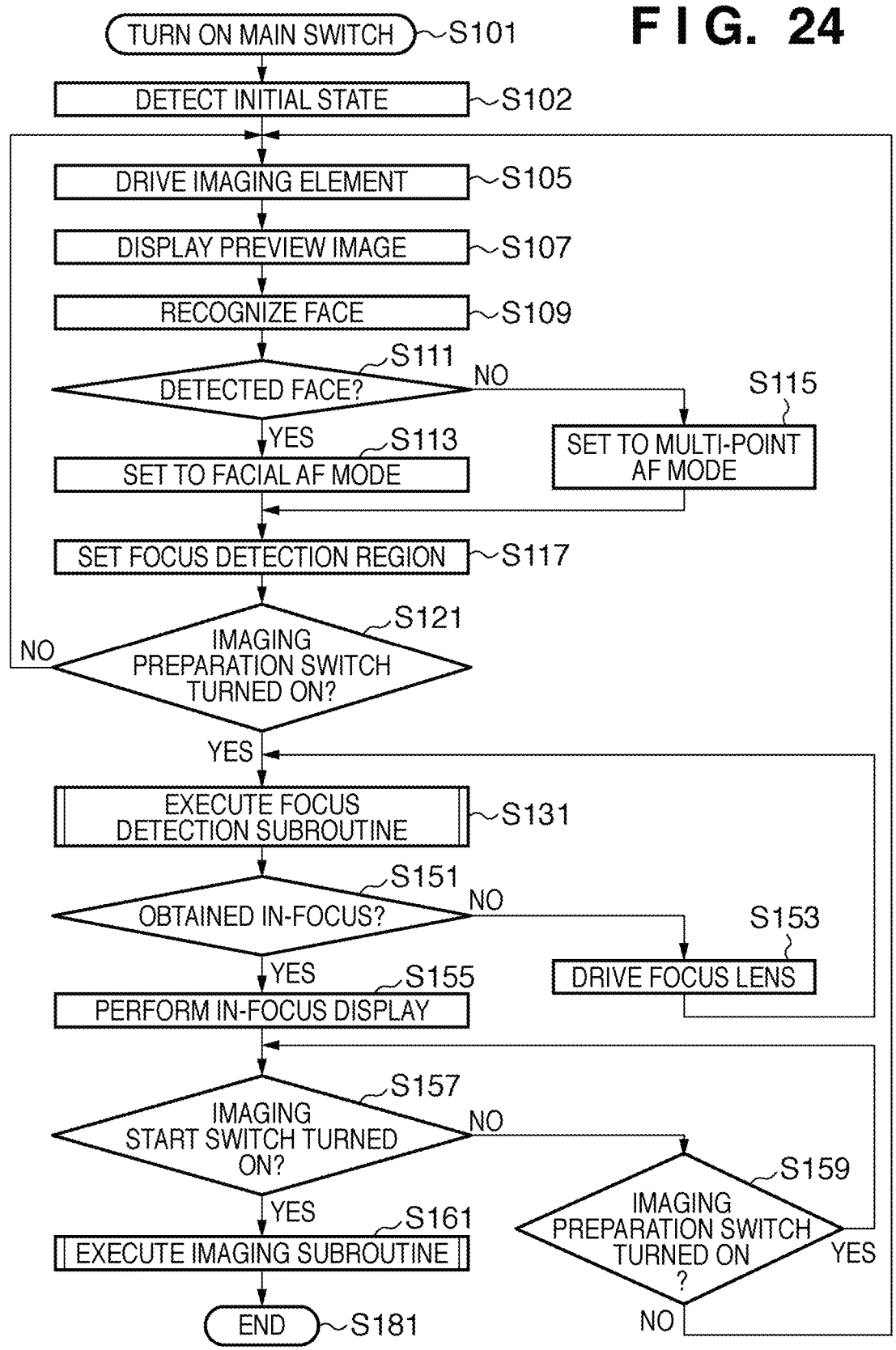
FIG. 24 is a flowchart showing a main process of the camera according to the third embodiment.

FIGS. 22 to 24 are views illustrating a third embodiment. Hereinafter, the third embodiment will be described with reference to these drawings. Here, in this embodiment, a description of constituent elements similar to those in the first or the second embodiment described above is omitted.

FIG. 22 is a view schematically showing the configuration of a camera 1a including a focus detection apparatus according to the third embodiment. As shown in FIG. 22, the camera 1a is a digital still camera in which the image sensor 10 (imaging element) is disposed on an image plane of the imaging lens 5. Here, the electric configuration, such as a process circuit including a defect storage means that stores defect information on a focus detection sensor 205, is similar to that in the first embodiment, and, thus, a description thereof is omitted in this embodiment.

In the camera 1a, in a state where a user determines the composition, the optical path of light that is incident from the imaging lens 5 is re-directed by a quick return mirror 200, and light fluxes are guided to the ocular 3 for observing an object image. Here, the quick return mirror 200 is a semi-reflecting face, and light fluxes other than the light fluxes guided to the ocular 3 are guided to the focus detection sensor 205. The focus detection sensor 205 includes a pupil division means that forms images of a pair of light fluxes that have passed through mutually different pupil regions of the imaging optical system, a first area on which an image of one of the pair of light fluxes is formed, and a second area on which an image of the other light flux of the pair of light fluxes is formed.

Here, the pupil division means in the camera 1a will be described with reference to FIGS. 22 and 23. As shown in FIG. 23, the pupil division means in the focus detection sensor 205 includes a field lens 201, a viewing field mask 202, a pupil division mask 203, and two-dimensional image lenses 204a and 204b. The viewing field mask 202 is disposed near the image plane of the imaging lens 5, and defines the focus detection range. The pupil division mask 203 having aperture openings 203a and 203b is disposed on the side closer to the imaging lens 5 than the two-dimensional image lenses 204a and 204b. The aperture openings 203a and 203b regulate the light fluxes that are incident on the two-dimensional image lenses 204a and 204b. The pupil division mask 203 is positioned such that an image is formed substantially at the exit pupil of the imaging lens 5 due to the optical power of the field lens 201.

The pair of two-dimensional image lenses 204a and 204b form object images in the region determined by the viewing field mask 202, on a light-receiving area 206a functioning as a first area and a light-receiving area 206b functioning as a second area of the focus detection sensor 205. On the light-receiving areas 206a and 206b of the focus detection sensor 205, electric charge subjected to photoelectric conversion by the object image is read as an electrical signal and used for focus detection calculation using a phase difference. Accordingly, in the camera 1a, an appropriate lens position is calculated based on the electrical signal obtained from the light-receiving areas 206a and 206b, and, thus, the amount of defocus according to the focus detection viewing field can be obtained.

FIG. 24 is a flowchart showing the main process of the camera 1a. Here, the focus detection subroutine and the imaging subroutine are executed according to the flowcharts in FIGS. 10 and 11 exemplified in the first embodiment. Furthermore, in the flowchart shown in FIG. 24, constituent elements that perform the same operation as that in the first embodiment are denoted by the same reference numerals. Hereinafter, aspects different from those in the first embodiment will be described.

As shown in FIG. 24, this embodiment is different from the first embodiment in that the main process does not include S103 and S104. In this embodiment, light fluxes are guided via a semi-transmissive quick return mirror to a so-called two-dimensional image optical system for guiding object images to the focus detection sensor 205, and, thus, the mirror-up operation or the shutter-opening operation are not necessary. Furthermore, in S163 of the imaging subroutine, the operation is performed in which the shutter is closed and then runs in the first embodiment. Conversely, in this embodiment, since the shutter is closed when the procedure reaches S163, a shutter-running operation similar to that in a conventional silver halide camera may be performed. Here, the other operations are the same as those in the first embodiment.

Here, the focus detection sensor 205 exemplified in FIG. 23 may be a so-called area sensor in which the light-receiving areas 206a and 206b spread out two-dimensionally, or a so-called line sensor in which a plurality of lines for obtaining a pair of images are provided. The present invention can be easily applied to this sort of sensor. More specifically, in S133, signals of the focus detection sensor 205 for performing focus detection need only be read, and the following operation may be similar to that in the first embodiment.

According to this embodiment, the influence of a defective pixel contained in the focus detection sensor 205 can be reduced by performing processing on a defective pixel of the focus detection sensor 205 according to the above-described simple algorithm (flow). Accordingly, the camera la can provide a user with an accurate in-focus image obtained by imaging. Furthermore, since a defective pixel in the imaging lens 5 can be allowed, the yield of the imaging lens 5 increases, and the cost can be reduced.

Note that the description in the foregoing embodiments is merely exemplary, and the present invention is not limited thereto. Appropriate changes can be made to the configurations and operations in the embodiments described above.

For example, in the foregoing embodiments, the case is exemplified in which there is a defective pixel in the A image of the focus detection pixel groups, but it will be appreciated that similar processing is performed also in the case where there is a defective pixel in the B image. Furthermore, similar processing is performed also in the case where there is a defective pixel in both the A image and the B image of the focus detection pixel groups.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-315027, filed Dec. 10, 2008, which is hereby incorporated by reference herein in its entirety.

The invention claimed is:

1. A focus detection apparatus that detects a focusing status on an image plane obtained using an imaging optical system, comprising:
   a focus detection sensor that includes a plurality of first focus detection pixels and a plurality of second focus detection pixels, and that has a plurality of focus detection pixel pairs each including a first focus detection pixel and a second focus detection pixel;
   a storage unit that stores defect information indicating a defective pixel of the focus detection sensor;
   a correction unit that corrects a value of the defective pixel indicated by the detect information and a value of one of the first focus detection pixel and the second focus detection pixel that forms the focus detection pixel pair with the defective pixel based on a value of a focus detection pixel of a same type that is not the defective pixel;
   a calculation unit that obtains an amount of image shift when a correlation amount becomes a maximum by repeatedly performing the image shift between a first focus detection image obtained from the first focus detection pixels and a second focus detection image obtained from the second focus detection pixels and calculation of the correlation amount between the first focus detection image obtained from the first focus detection pixels and the second focus detection image obtained from the second focus detection pixels;
   a determination unit that determines the first focus detection pixel or the second focus detection pixel that forms the focus detection pixel pair with the defective pixel as a focus detection pixel to be corrected when the image shift is performed with the amount of image shift obtained by said calculation unit; and
   a detecting unit that detects the focusing status based on a phase difference between a first focus detection image obtained from the first focus detection pixels and a second focus detection image obtained from the second focus detection pixels of the plurality of focus detection pixel pairs after the correction performed by the correction unit.

2. The focus detection apparatus according to claim 1, wherein the plurality of focus detection pixel pairs are arranged in a dispersed manner at a predetermined pitch on an imaging element that is disposed on the image plane including a plurality of pixels that photoelectrically convert an object image.

3. The focus detection apparatus according to claim 1, wherein the focus detection sensor includes a pupil division means that forms images of a pair of light fluxes that have passed through mutually different pupil regions of the imaging optical system, a first area on which an image of one of the pair of light fluxes is formed, and a second area on which an image of another light flux of the pair of light fluxes is formed, and the plurality of first focus detection pixels are arranged in the first area, and the plurality of second focus detection pixels are arranged in the second area.

4. The focus detection apparatus according to claim 1, wherein said correction unit performs the correction based on a value of a focus detection pixel exists on a direction different from a direction on which the phase difference is detected.

5. The focus detection apparatus according to claim 1, wherein when the image shift between the first focus detection image and the second focus detection image and calculation of the correlation amount between the first focus detection image and the second focus detection image are repeatedly performed, said calculation unit performs every image shift a preprocessing to determine the first focus detection pixel or the second focus detection pixel that forms the focus detection pixel pair with the defective pixel and to perform the correction based on a value of a focus detection pixel of the same type that is not the defective pixel, and performs the calculation of the correlation amount based on a signal of the focus detection pixel processed by the preprocessing.

6. A method for controlling a focus detection apparatus that includes: a focus detection sensor that includes a plurality of first focus detection pixels and a plurality of second focus detection pixels, and that has a plurality of focus detection pixel pairs each including a first focus detection pixel and a second focus detection pixel; and a storage unit that stores defect information indicating a defective pixel of the focus detection sensor; and that detects a focusing status on an image plane obtained using an imaging optical system, comprising:

a correcting step of performing correction of a value of the defective pixel indicated by the defect information and a value of one of the first focus detection pixel and the second focus detection pixel that forms the focus detection pixel pair with the defective pixel based on a value of a focus detection pixel of a same type that is not the defective pixel;

a calculation step of obtaining an amount of image shift when a correlation amount becomes a maximum by repeatedly performing the image shift between a first focus detection image obtained from the first focus detection pixels and a second focus detection image obtained from the second focus detection pixels and calculation of the correlation amount between the first focus detection image obtained from the first focus detection pixels and the second focus detection image obtained from the second focus detection pixels;

a determination step of determining the first focus detection pixel or the second focus detection pixel that forms the focus detection pixel pair with the defective pixel as a focus detection pixel to be corrected when the image shift is performed with the amount of image shift obtained by said calculation step; and a detecting step of performing detection of the focusing status based on a phase difference between a first focus detection image obtained from the first focus detection pixels and a second focus detection image obtained from the second focus detection pixels of the plurality of focus detection pixel pairs after the correction performed in the correcting step.

* * * * *